United States Patent
Tu et al.

(10) Patent No.: US 12,389,635 B2
(45) Date of Patent: Aug. 12, 2025

(54) SEMICONDUCTOR DEVICE AND MANUFACTURING METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chien-Te Tu, Hsinchu (TW); Chee-Wee Liu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 451 days.

(21) Appl. No.: 17/890,080

(22) Filed: Aug. 17, 2022

(65) Prior Publication Data
US 2024/0063284 A1 Feb. 22, 2024

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .. H10D 30/6735; H10D 30/014; H10D 30/43; H10D 30/6757; H10D 62/121; H10D 62/151; H10D 64/021; H10D 84/0128; H10D 84/013; H10D 84/0147; H10D 84/038; H10D 64/017; H10D 62/82; H10D 62/116; H10D 62/364; H10D 62/822; H10D 64/518
See application file for complete search history.

(56) References Cited

U.S. PATENT DOCUMENTS 9,209,247 B2   12/2015   Colinge et al.
9,236,267 B2   1/2016    De et al.
(Continued)

OTHER PUBLICATIONS

Nicolas Loubet et al., "Nanosheet Transistor as a Replacement of FinFET for Future nodes : Device Advantages & Specific Process Elements." 2020 Symposia on VLSI Technology and Circuits , 2020.
(Continued)

*Primary Examiner* — Thanh T Nguyen
(74) *Attorney, Agent, or Firm* — Maschoff Brennan

(57) ABSTRACT

A method includes forming an epitaxial stack over a semiconductor substrate, wherein the epitaxial stack comprises a plurality of sacrificial layers and a plurality of channel layers alternately arranged over the semiconductor substrate, and each of the sacrificial layers is a multi-layer film comprising a bottom epitaxial layer, a middle epitaxial layer over the bottom epitaxial layer, and a top epitaxial layer over the middle epitaxial layer, wherein the middle epitaxial layer has a lower germanium concentration than the bottom and top epitaxial layers; laterally recessing the sacrificial layers to form sidewall recesses alternating with the channel layers; forming inner spacers in the sidewall recesses; forming source/drain epitaxial structures on opposite sides of the channel layers.

20 Claims, 30 Drawing Sheets

(51) Int. Cl.
*H10D 30/43* (2025.01)
*H10D 62/10* (2025.01)
*H10D 62/13* (2025.01)
*H10D 64/01* (2025.01)
*H10D 84/01* (2025.01)
*H10D 84/03* (2025.01)

(52) U.S. Cl.
CPC ....... *H10D 30/6757* (2025.01); *H10D 62/121* (2025.01); *H10D 62/151* (2025.01); *H10D 64/021* (2025.01); *H10D 84/0128* (2025.01); *H10D 84/013* (2025.01); *H10D 84/0147* (2025.01); *H10D 84/038* (2025.01)

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,177,344 | B2 | 11/2021 | Wang et al. |
| 2018/0366375 | A1* | 12/2018 | Chen .......... H10D 62/116 |
| 2019/0214459 | A1* | 7/2019 | Cheng .......... H10D 30/024 |
| 2020/0058653 | A1* | 2/2020 | Chiang .......... H10D 62/80 |
| 2021/0273047 | A1* | 9/2021 | Kuan .......... H10D 62/151 |
| 2022/0059652 | A1 | 2/2022 | Wang et al. |
| 2023/0163212 | A1* | 5/2023 | Bomberger ........ H01L 21/0259 257/347 |

OTHER PUBLICATIONS

J. Zhang et al., "Full Bottom Dielectric Isolation to Enable Stacked Nanosheet Transistor for Low Power and High Performance Applications." 2019 IEEE International Electron Devices Meeting (IEDM), 2019, pp. 11.6.1-11.6.4.

Julien Frougier et al., "Gate-All-Around NanoSheet CMOS Technology." 2021 International Conference on Solid State Devices and Materials , 2021.

V. Destefanis et al., "HCl Selective Etching of Si1-xGex versus Si for Silicon On Nothing and Multi Gate Devices." ECS Transactions, 16(10), 2008 pp. 427-438.

N. Loubet et al., "A Novel Dry Selective Etch of SiGe for the Enablement of High Performance Logic Stacked Gate-All-around Nanosheet Devices." 2019 IEEE International Electron Devices Meeting (IEDM), 2019, pp. 11.4.1-11.4.4.

N. Loubet et al., "Stacked Nanosheet Gate-All-Around Transistor to Enable Scaling Beyond FinFET." 2017 Symposium on VLSI Technology Digest of Technical Papers, 2017, pp. T230-T231.

* cited by examiner

SEMICONDUCTOR DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
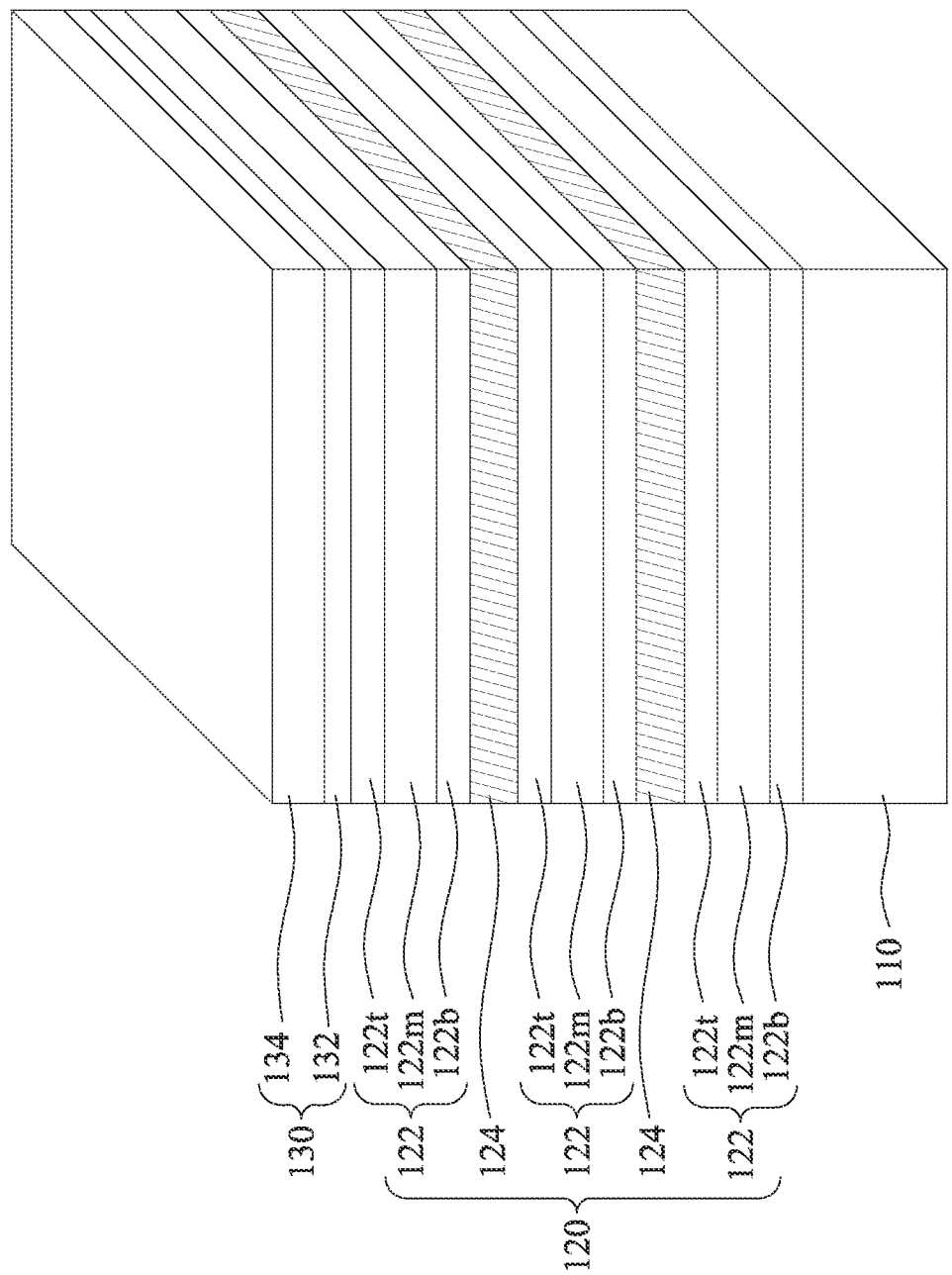
FIGS. 1-13D illustrate schematic views of intermediate stages in the manufacture of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "multi-gate device" is used to describe a device (e.g., a semiconductor transistor) that has at least some gate material disposed on multiple sides of at least one channel of the device. In some examples, the multi-gate device may be referred to as a gate all around (GAA) device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

Figure 2:
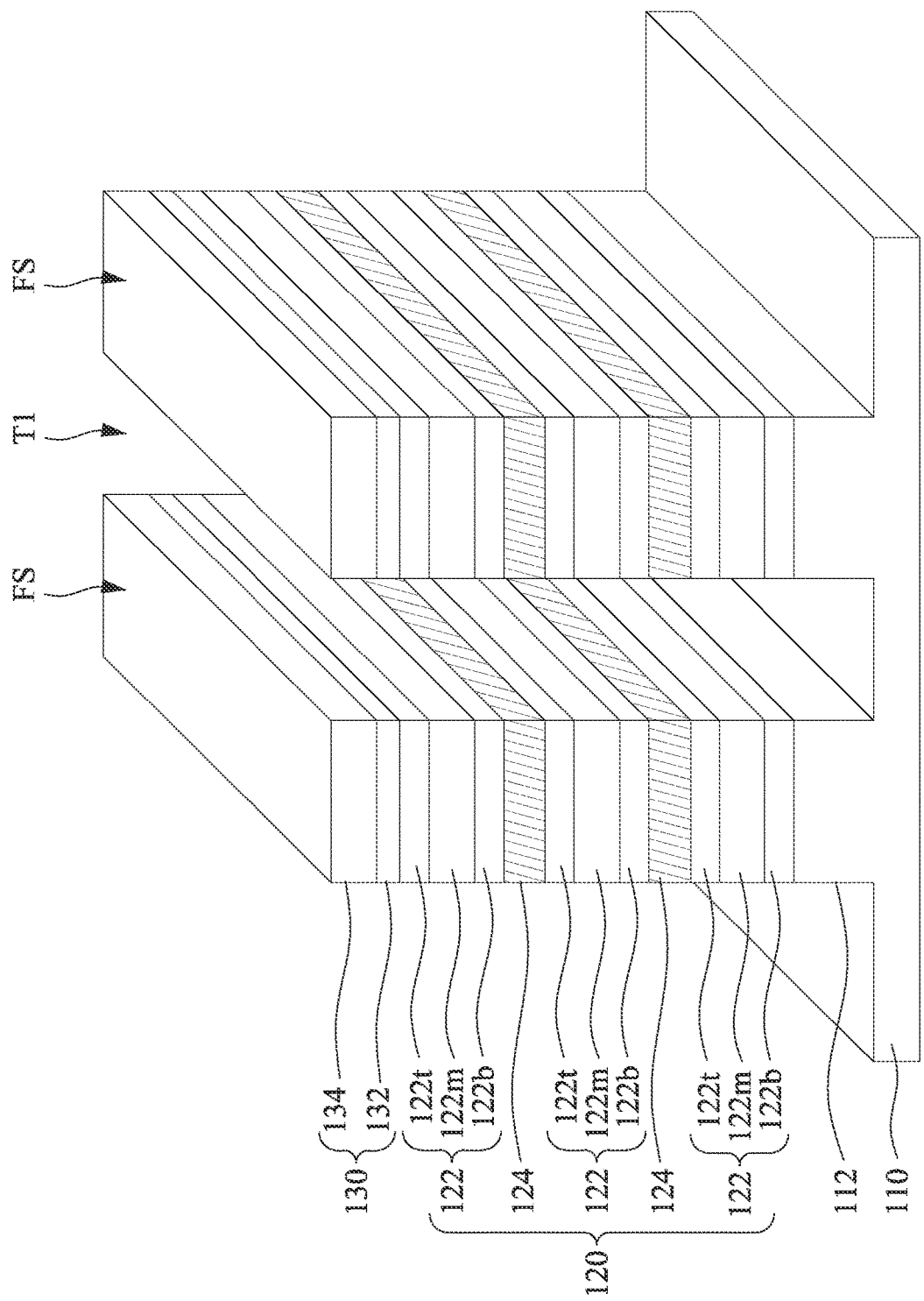
Figure 3:
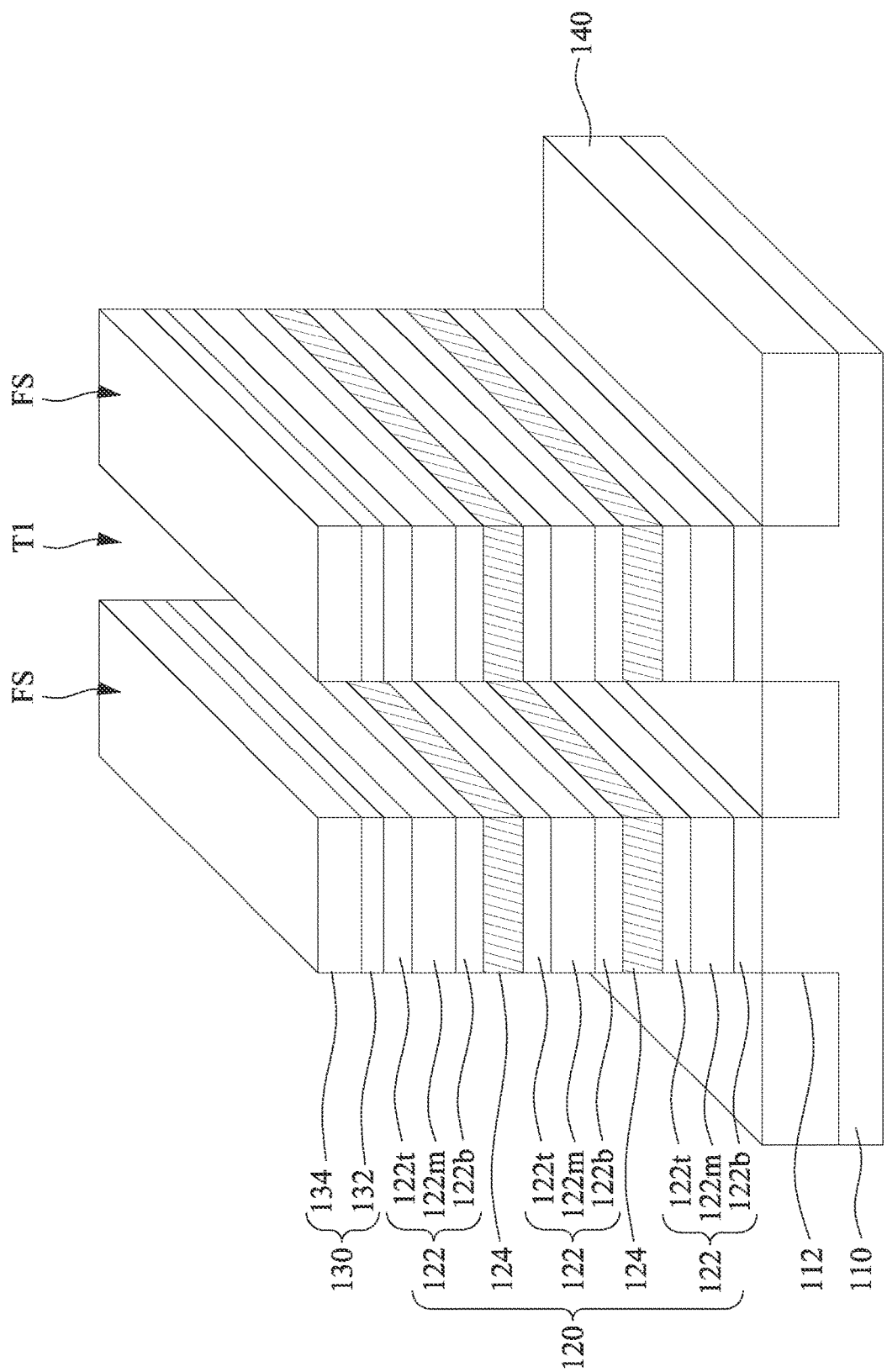

FIGS. 1-13D illustrate schematic views of intermediate stages in the manufacture of a semiconductor device in accordance with some embodiments of the present disclosure. FIGS. 1-3 are schematic perspective views of the semiconductor device at various stages in accordance with some embodiments. FIGS. 4A, 5A, 6A, 10A, 11A, 12A, 13A are top views of the semiconductor device at various stages in accordance with some embodiments. FIGS. 4B, 5B, 6B, 7A, 8, 9A, 10B, 11B, 12B, and 13B are cross-sectional views of the semiconductor device (e.g., taken along line X-X in FIGS. 4A, 5A, 6A, 10A, 11A, 12A, 13A) at various manufacturing stages in accordance with some embodiments. FIGS. 4C, 12C, and 13C are cross-sectional views of the semiconductor device (e.g., taken along line Y-Y in FIGS. 4A, 12A, and 13A) at various manufacturing stages in accordance with some embodiments. It is understood that additional steps may be provided before, during, and after the steps shown in FIGS. 1-13D, and some of the steps described below can be replaced or eliminated for additional embodiments of the method. The order of the operations/processes may be interchangeable.

Reference is made to FIG. 1. An epitaxial stack 120 is formed over a substrate 110. In some embodiments, the substrate 310 may include silicon (Si). Alternatively, the substrate 310 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 310 may include a semiconductor-on-insulator (SOI) structure such as a buried dielectric layer. Also, the substrate 310 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 120 includes sacrificial layers 122 interposed by channel layers 124. In some embodiments, each of the sacrificial layers 122 may be a multi-layer film including a bottom epitaxial layer 122b, a middle epitaxial layer 122m, and a top epitaxial layer 122t. The epitaxial layers 122b/122t, 122m, and the channel layers 124 may have different semiconductor compositions from each other. In some embodiments, the epitaxial layers 122b/122t, 122m, and the channel layers 124 may include SiGe with different semiconductor compositions. For example, for forming an n-type device, a Si concentration in the middle epitaxial layer 122m is greater than a Si concentration in the bottom and top epitaxial layers 122b and 122t but less than a Si concentration in the channel layers 124. Stated differently, in the embodiments, for forming an n-type device, a Ge concentration in the middle epitaxial layer 122m is less than a Ge concentration in the bottom and top epitaxial layers 122b and 122t but greater than a Ge concentration in the channel layers 124. For example, the bottom and top epitaxial layers 122b and 122t are $Si_xGe_{1-x}$, the middle epitaxial layers 122m is $Si_yGe_{1-y}$, and the channel layers 124 are $Si_zGe_{1-z}$, in which x, y, z are in a range from 0 to 1, and z>y>x. In some embodiments, x is in a range from about 0 to about 0.02, y is in a range from about 0.02 to about 0.08, z is in a range from about 0.1 to about 0.2. In some alternative embodiments, x is in a range from about 0.4 to about 0.6, y is in a range from about 0.6 to about 0.8, z is in a range from about 0.9 to about 1. However, other embodiments are possible including those that provide for the material/compositions having different oxidation rates and/or etch selectivity. In some embodiments where the epitaxial layers 122b, 122m, and 122t include SiGe and the channel layers 124 include Si, the Si oxidation rate of the channel layers 124 is less than the SiGe oxidation rate of the middle epitaxial layers 122m, and the SiGe oxidation rate of the middle epitaxial layers 122m is less than the SiGe oxidation rate of the bottom and top epitaxial layers 122b and 122t. In some embodiments where the epitaxial layers 122b and 122t include Ge, the epitaxial layers 122m and the channel layers 124 include SiGe, the SiGe oxidation rate of the channel layers 124 is less than the SiGe oxidation rate of the middle epitaxial layers 122m, and the SiGe oxidation rate of the middle epitaxial layers 122m is less than the Ge oxidation rate of the bottom and top epitaxial layers 122b and 122t. In the illustrated embodiments, the epitaxial layers 122b and 122t may have similar or the same semiconductor composition. For example, the epitaxial layers 122b and 122t may include SiGe with similar or the same semiconductor composition. In some alternative embodiments, the epitaxial layers 122b and 122t may have different semiconductor compositions depending on requirement. For example, the epitaxial layers 122b and 122t may include SiGe with different Ge concentrations, and the different Ge concentrations of the epitaxial layers 122b and 122t are greater than the Ge concentration of the epitaxial layer 122m and the channel layer 124.

The channel layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the channel layers 124 to define a channel or channels of a device is further discussed below.

It is noted that three layers of the sacrificial layers 122 and three layers of the channel layers 124 are alternately arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of channel layers 124 is between 2 and 10. The sacrificial layers 122 in channel regions(s) may eventually be removed and serve to define a vertical distance between adjacent channel region(s) for a subsequently-formed multi-gate device.

The epitaxial layers 122b, 122m, 122t may have a same thickness in some embodiments. In some alternative embodiments, the epitaxial layers 122m may have a thickness greater or less than a thickness of the epitaxial layers 122b and 122t. The sacrificial layer 122 may have a thickness greater than that of the channel layers 124. In some embodiments, each of the channel layer 124 and the epitaxial layers 122b, 122m, and 122t may have a same thickness, such that a thickness of the sacrificial layer 122 is about three times the thickness of the epitaxial layers 122b, 122m, or 122t. In some alternative embodiments, each of the epitaxial layers 122b, 122m, and 122t may have a thickness greater than or less than that of the channel layer 124. In some other embodiments, the sacrificial layer 122 may have a thickness equal to or less than that of the channel layers 124.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the channel layers 124 include suitable semiconductor material, such as like Si, Ge, Sn, SiGe, GeSn, III-V semiconductor, the like, or the combination thereof. In some embodiments, the channel layers 124 may include a same semiconductor material as that substrate 310. In some embodiments, the epitaxially grown sacrificial layers 122 (including the layers 122b, 122m, and 122t) include a different material than the substrate 310. For example, the epitaxial layers 122b, 122m, and 122t of the sacrificial layers 122 include suitable semiconductor material, such as Si, Ge, SiGe, GeSn, III-V semiconductor, the like, or the combination thereof. As stated above, in at least some examples, the bottom and top epitaxial layers 122b and 122t are $Si_xGe_{1-x}$, the middle epitaxial layers 122m is $Si_yGe_{1-y}$, and the channel layers 124 are $Si_zGe_{1-z}$, in which x, y, z are in a range from 0 to 1, and z>y>x. In some alternative embodiments, the bottom and top epitaxial layers 122b and 122t are $Ge_xSn_{1-x}$, the middle epitaxial layers 122m is $Ge_ySn_{1-y}$, and the channel layers 124 are $Ge_zSn_{1-z}$, in which x, y, z are in a range from 0 to 1, and x>y>z. In some other embodiments, at least one of the layers 122b, 122m, 122t, and 124 may include other materials such as a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. As discussed, the materials of the layers 122b, 122m, 122t, and 124 may be chosen based on providing differing oxidation and/or etching selectivity properties. In some embodiments, the layers 122b, 122m, 122t, and 124 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

In some embodiments, prior to forming the epitaxial stack 120, a strain relaxed buffer (SRB) is optionally formed over the substrate 110. The strain relaxed buffer may comprise suitable composition for relaxing the lattice strain between the substrate 110 and the epitaxial stack 120. For example, when the substrate 110 comprises Si, and the sacrificial layers 122 comprises SiGe, the strain relaxed buffer may include SiGe and has a greater Si concentration than that of the bottom epitaxial layer 122b of the bottommost sacrificial layer 122.

Reference is made to FIG. 2. A plurality of semiconductor fins FS extending from the substrate 110 are formed. In various embodiments, each of the fins FS includes a substrate portion 112 formed from the substrate 110 and portions of each of the epitaxial layers of the epitaxial stack 120 including epitaxial layers 122 and 124. The fins FS may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120. The etching process can include dry etching, wet etching, reactive ion etching (RIE), and/or other suitable processes.

In the illustrated embodiment as illustrated in FIGS. 2 and 3, a hard mask (HM) layer 130 is formed over the epitaxial stack 120 prior to patterning the fins 130. In some embodiments, the HM layer 130 includes an oxide layer 132 (e.g., a pad oxide layer that may include $SiO_2$) and a nitride layer 134 (e.g., a pad nitride layer that may include $Si_3N_4$) formed over the oxide layer. The oxide layer 132 may act as an adhesion layer between the epitaxial stack 120 and the nitride layer 134 and may act as an etch stop layer for etching the nitride layer 134. In some examples, the HM oxide layer 132 includes thermally grown oxide, chemical vapor deposition (CVD)-deposited oxide, and/or atomic layer deposition (ALD)-deposited oxide. In some embodiments, the HM nitride layer 134 is deposited on the HM oxide layer 132 by CVD and/or other suitable techniques.

The fins FS may subsequently be fabricated using suitable processes including photolithography and etch processes. The photolithography process may include forming a photoresist layer (not shown) over the HM layer 130, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the substrate 110, and layers formed thereupon, while an etch process forms trenches T1 in unprotected regions through the HM layer 130, through the epitaxial stack 120, and into the substrate 110, thereby leaving the plurality of extending fins FS. The trenches T1 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins FS.

Reference is made to FIG. 3. Shallow trench isolation (STI) features 140 are formed interposing the fins FS. By way of example and not limitation, a dielectric layer is first deposited over the substrate 110, filling the trenches T1 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, the dielectric layer (and subsequently formed STI features 140) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 130 (as illustrated FIG. 3) functions as a CMP stop layer. Referring to the example of FIG. 3, the STI features 140 interposing the fins FS are recessed providing the fins FS extending above the STI features 140. In some embodiments, the recessing process may include a dry etching process, a wet etching process, and/or a combination thereof. The HM layer 130 may also be removed before, during, and/or after the recessing of the STI features 140. The nitride layer 134 of the HM layer 130 may be removed, for example, by a wet etching process using $H_3PO_4$ or other suitable etchants. In some embodiments, the oxide layer 132 of the HM layer 130 is removed by the same etchant used to recess the STI features 140. In some embodiments, a recessing depth is controlled (e.g., by controlling an etching time) so as to result in a desired height of the exposed upper portion of the fins FS. In the illustrated embodiments, the desired height exposes each of the layers of the epitaxial stack 120 in the fins FS.

Figure 4A:
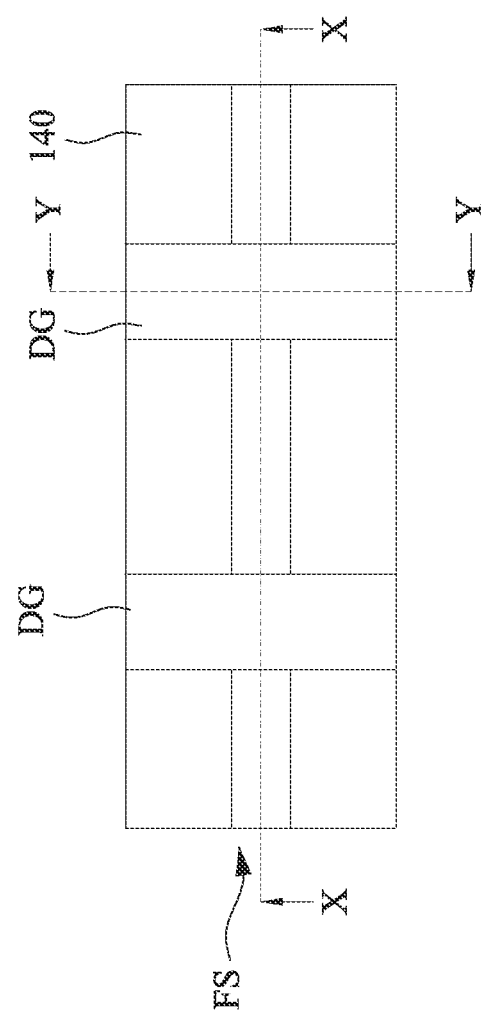
Figure 4B:
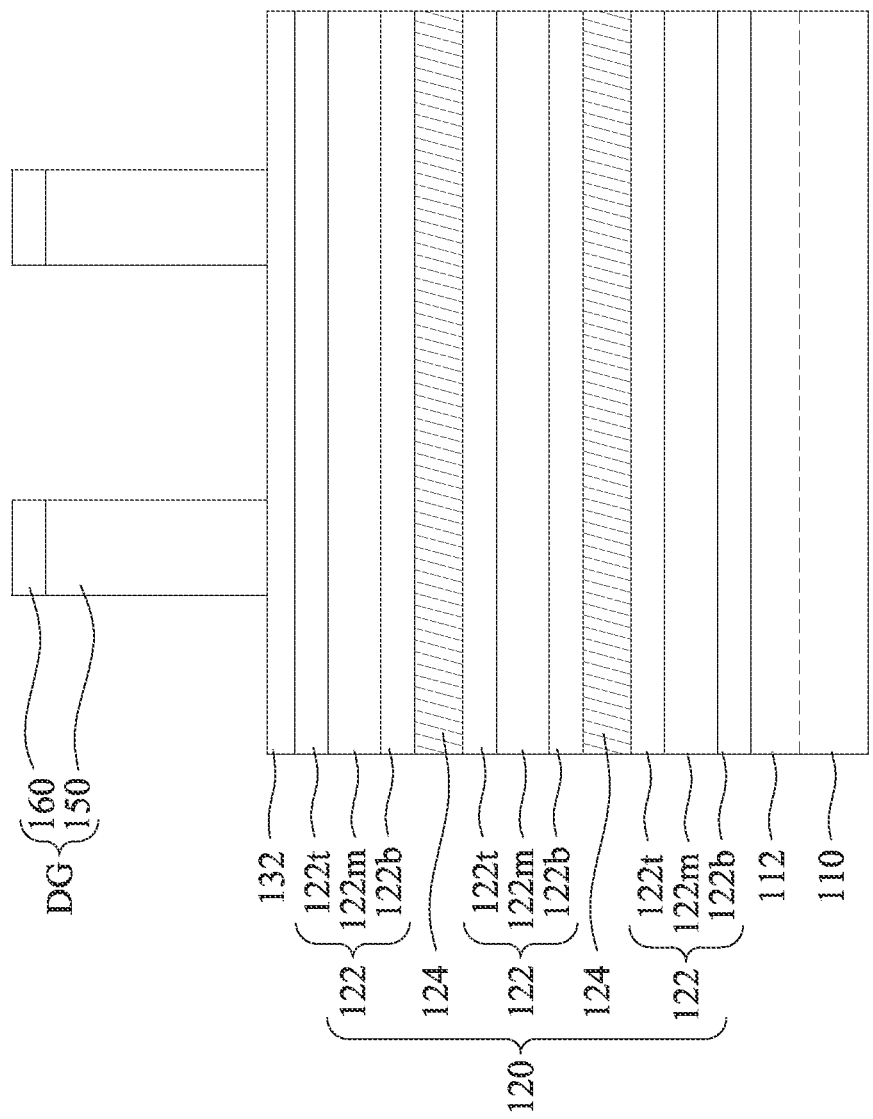
Figure 4C:
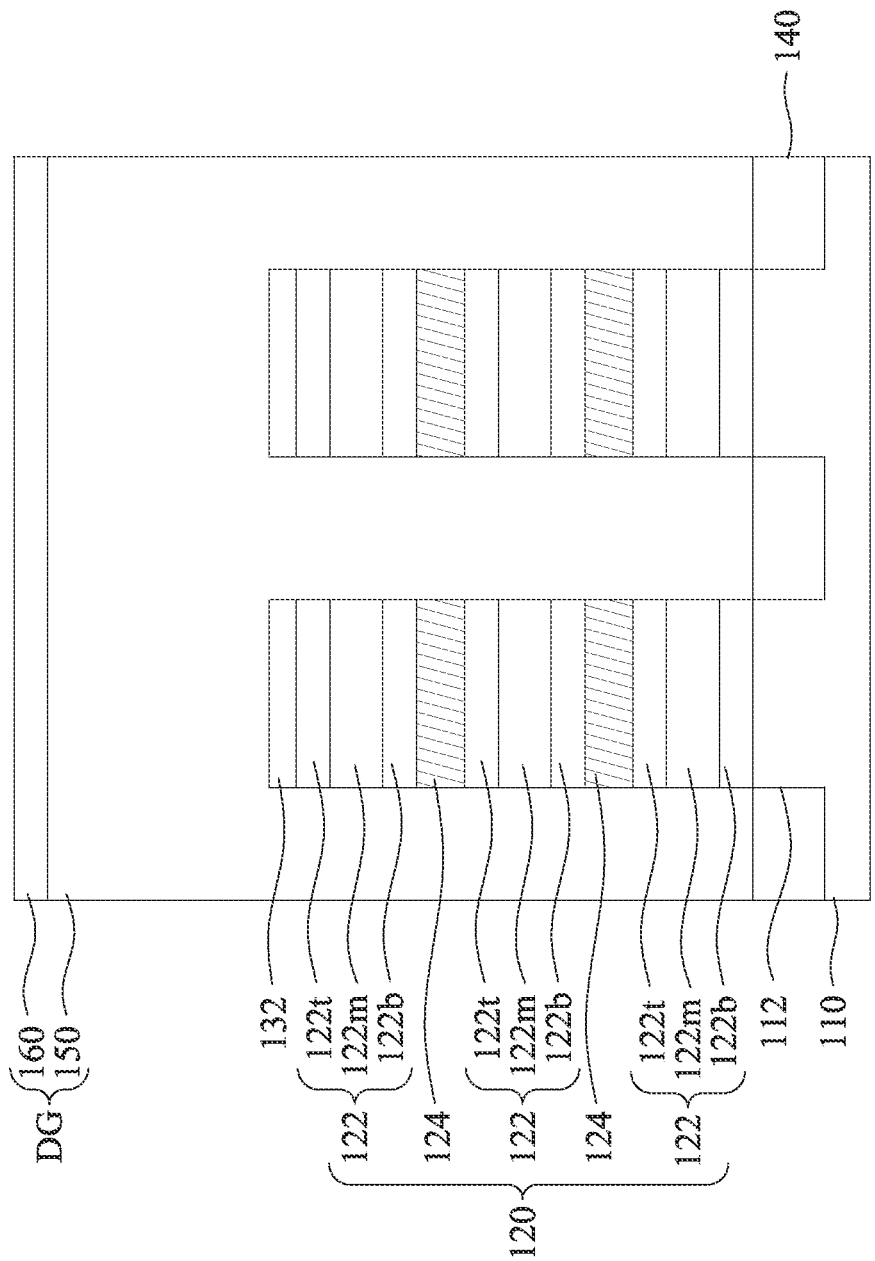

Reference is made to FIGS. 4A-4C. Gate structures DG are formed. In some embodiments, the gate structures DG are dummy (sacrificial) gate structures that are subsequently removed. Thus, in some embodiments using a gate-last process, the gate structures DG are dummy gate structures and will be replaced by the final gate structures at a subsequent processing stage of the semiconductor device. In particular, the dummy gate structures DG may be replaced at a later processing stage by a high-k dielectric layer (HK)

and metal gate electrode (MG) as discussed below. In some embodiments, the dummy gate structures DG are formed over the substrate 110 and are at least partially disposed over the fins FS. The portion of the fins FS underlying the dummy gate structures DG may be referred to as the channel region. The dummy gate structures DG may also define a source/drain (S/D) region of the fins FS, for example, the regions of the fin FS adjacent and on opposing sides of the channel region.

A dummy gate layer is formed on the fin FS. The dummy gate layer which will form a dummy gate 150 including a dummy gate dielectric layer and a dummy gate electrode layer over the dummy gate dielectric layer. The dummy gate dielectric layer may be formed of a dielectric material such as silicon oxide, silicon nitride, a combination thereof, or the like, which may be deposited or thermally grown according to acceptable techniques. The dummy gate electrode layer may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like.

A hard mask layer 160 is formed on the dummy gate layer and patterned by suitable lithography and etching processes. In some embodiments, the hard mask layer 160 may be formed of a dielectric material such as silicon nitride, silicon oxynitride, silicon oxycarbide (SiOC), silicon oxycarbonitride (SiOCN), the like, or a combination thereof. In the lithography process (e.g., photolithography or e-beam lithography) may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. Subsequently, a pattern of the patterned hard mask layer 160 formed on the dummy gate layer is transferred to the dummy gate layer by any acceptable etching technique, thereby patterning the dummy gate layer into the dummy gate 150. In some embodiments, the etching process may include dry etching (e.g., RIE etching), wet etching, and/or other etching methods. After the patterning process, the dummy gate 150 covers portions of the fins FS, which will be exposed in subsequent processing to form channel regions. The dummy gate 150 may also have a lengthwise direction substantially perpendicular (within process variations) to a lengthwise direction of the fin FS.

Figure 5A:
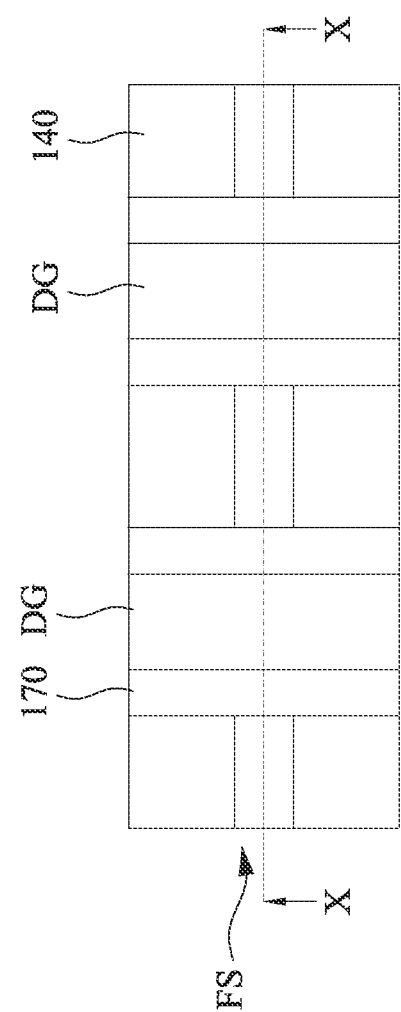
Figure 5B:
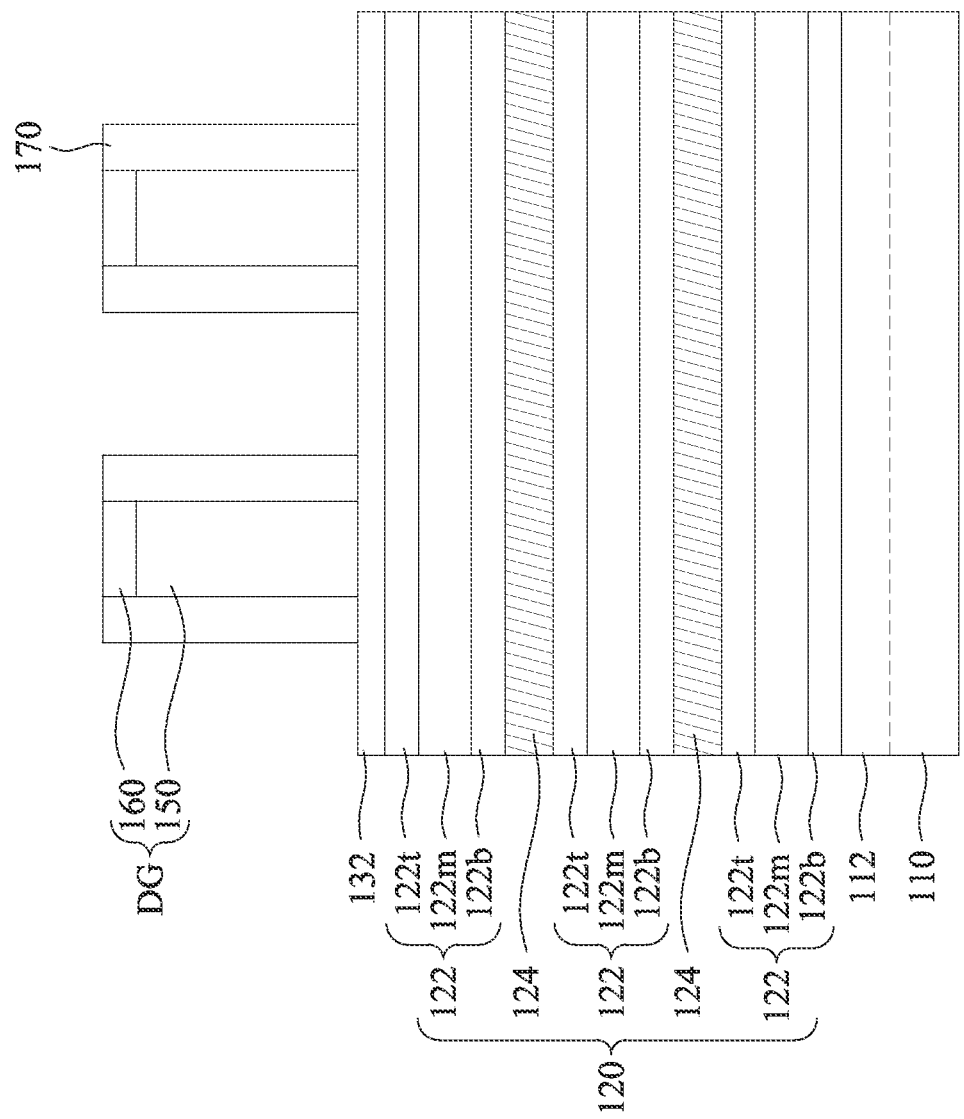

Reference is made to FIGS. 5A and 5B. After the formation of the dummy gate structures DG, gate spacers 170 are formed on sidewalls of the dummy gate structures DG. For example, a spacer material layer is conformally deposited on the substrate using processes such as, CVD process, a subatmospheric CVD (SACVD) process, a flowable CVD process, an ALD process, a PVD process, or other suitable process. The spacer material layer may include a dielectric material such as silicon oxide, silicon nitride, silicon carbide, silicon oxynitride, SiCN films, silicon oxycarbide, SiOCN films, and/or combinations thereof. The spacer material layer is subsequently etched back to form the gate spacers 170. For example, an anisotropic etching process is performed on the deposited spacer material layer to expose portions of the fins FS not covered by the dummy gate structures DG (in source/drain regions of the fins FS). Portions of the spacer material layer directly above the dummy gate structures DG may be completely removed by this anisotropic etching process. In some embodiments, the spacer material layer includes multiple layers, and therefore the gate spacers 170 may be multi-layer structures.

Figure 6A:
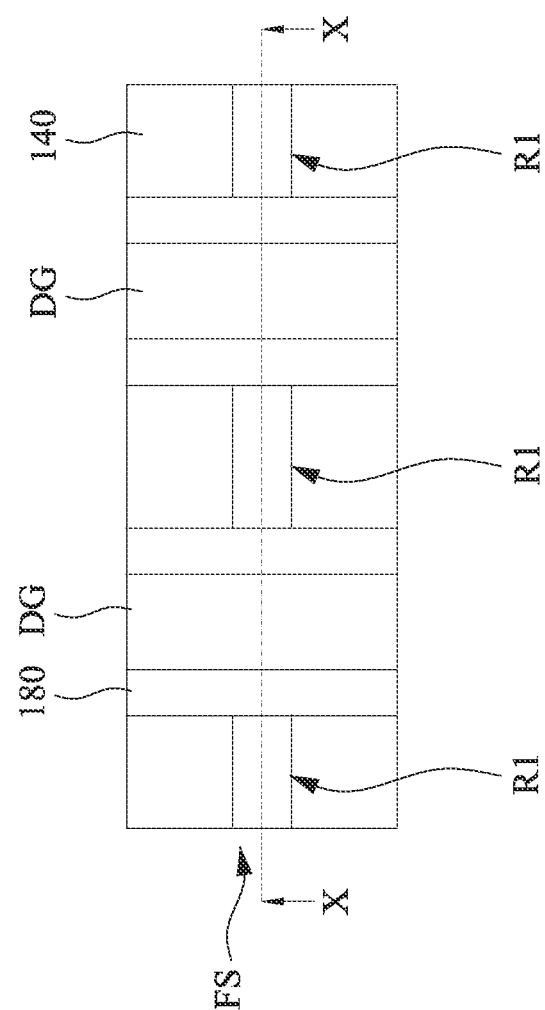
Figure 6B:
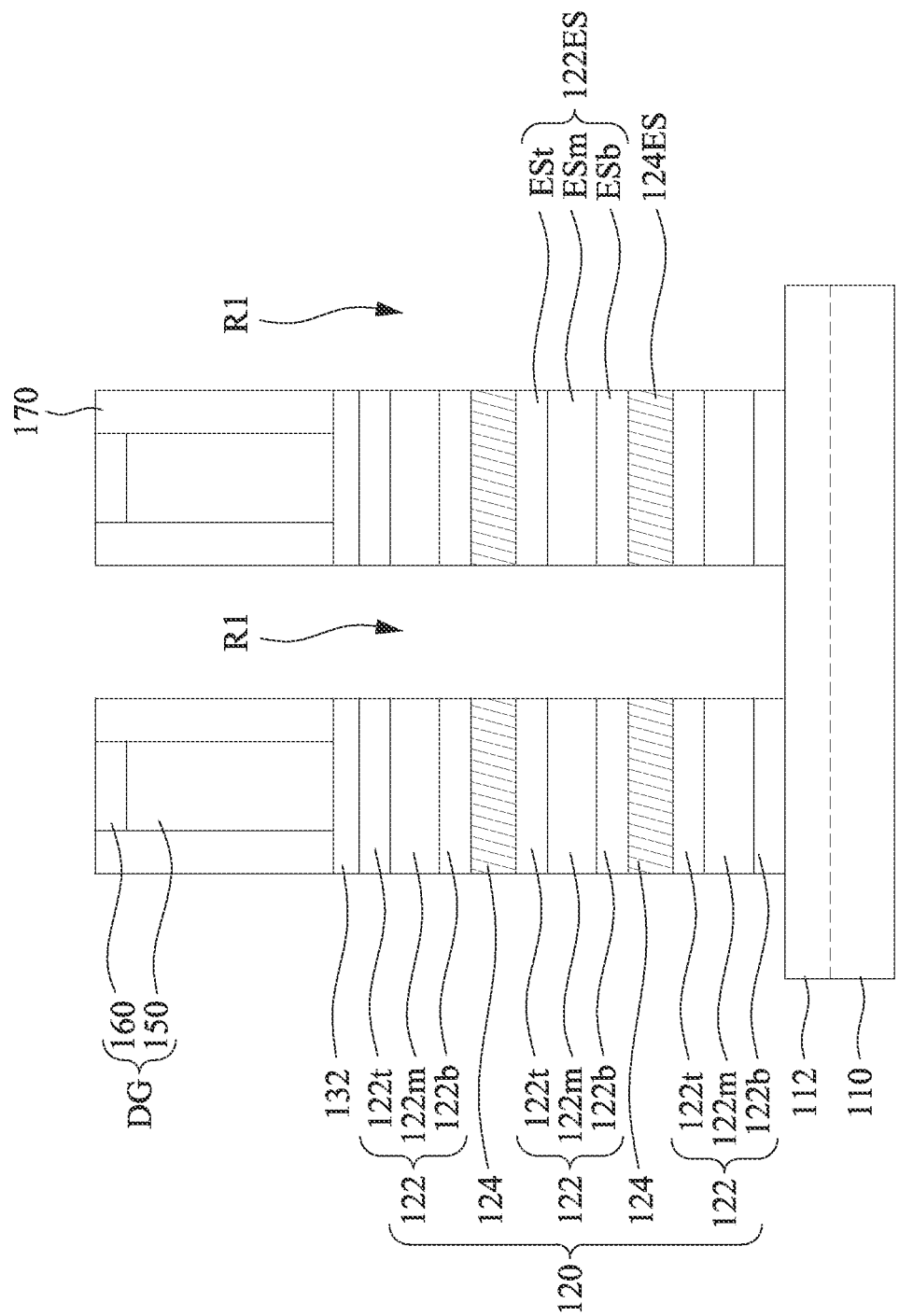

Reference is made to FIGS. 6A and 6B. Exposed portions of the semiconductor fins FS that extend laterally beyond the gate spacers 170 (e.g., in source/drain regions of the fins FS) are etched by using, for example, an anisotropic etching process that uses the dummy gate structure DG and the gate spacers 170 as an etch mask, resulting in recesses R1 into the semiconductor fins FS and between corresponding dummy gate structures DG. The recesses R1 may extend through the epitaxial layers 122b, 122m, and 122t and the channel layers 124. After the anisotropic etching, end surfaces 122ES of the sacrificial layers 122 (including an end surface ESb of the bottom epitaxial layer 122b, an end surface ESm of the middle epitaxial layer 122m, and an end surface ESt of the top epitaxial layer 122t) and end surfaces 124ES of channel layers 124 are exposed and aligned with respective outermost sidewalls of the gate spacers 170, due to the anisotropic etching. In some embodiments, the anisotropic etching may be performed by a dry chemical etch (e.g., reactive-ion etching) with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 7A:
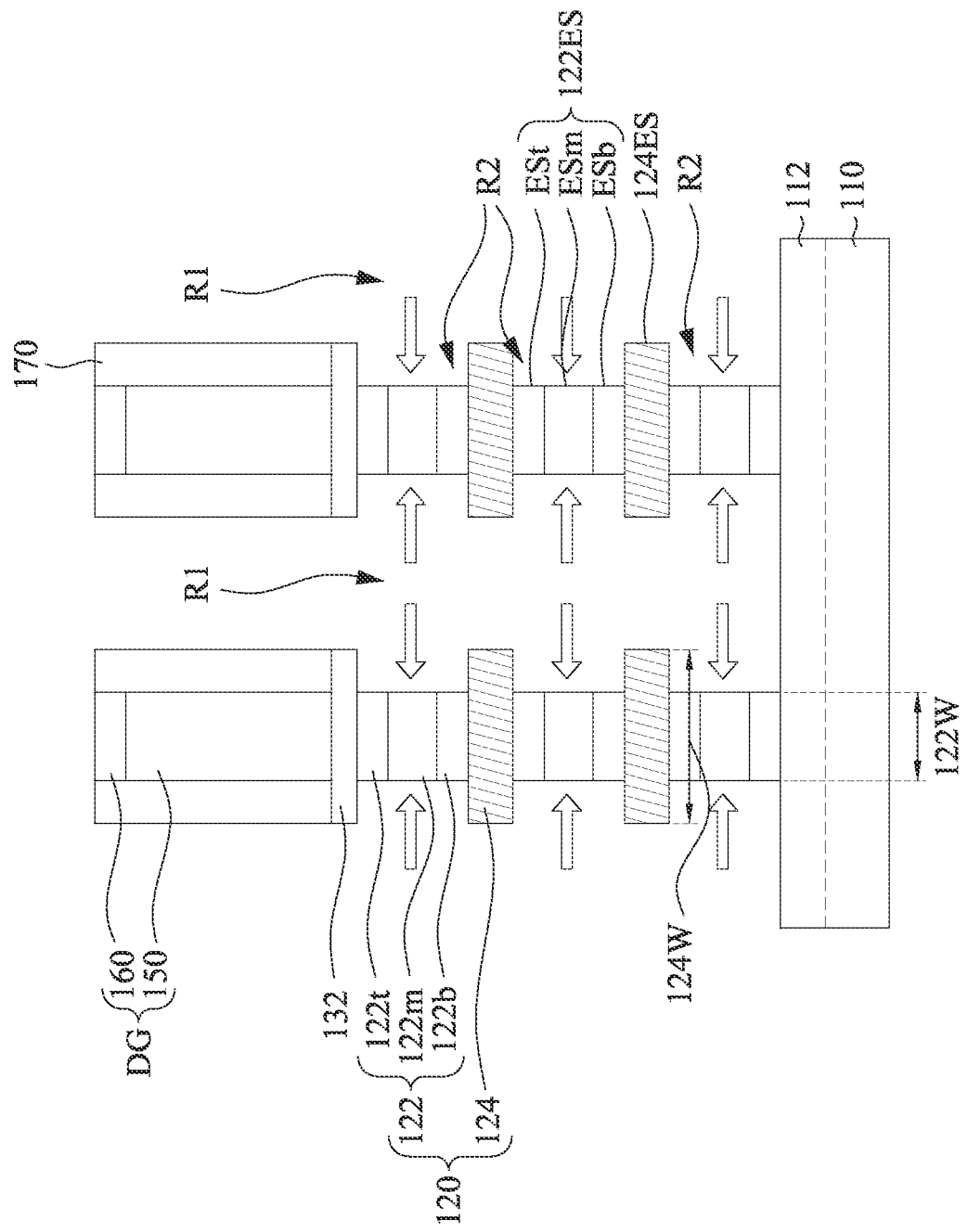

Reference is made to FIG. 7A. The sacrificial layers 122 are laterally or horizontally recessed by using suitable selective etching process, resulting in lateral/sidewall recesses R2 each vertically between corresponding channel layers 124. The lateral/sidewall recesses R2 may alternate with the channel layers 124. The arrows in FIG. 7A indicate the direction of the laterally etching. For example, end surfaces 122ES of the sacrificial layers 122 (including the end surfaces ESb, ESm, and ESt of the layers 122b, 122m, and 122t) are recessed by the selective etching process. The various compositions in epitaxial layers (e.g., $Si_xGe_{1-x}$ for the layers 122b and 122t, $Si_yGe_{1-y}$ for the layers 122m, and $Si_xGe_{1-x}$ for the layers 124) result in different oxidation rates and/or etch selectivity, thereby facilitating the selective etching process. In some embodiments, a selective dry etching process is performed by using fluoride-based etchant gas, such as $NF_3$, $SF_6$, the like, or the combination thereof. The fluoride-based gas may etch SiGe at a faster etch rate than it etches Si. The channel layers 124 may have a higher etch resistance to the etching process than that of the bottom, middle, and top epitaxial layers 122b, 122m, and 122t. In some embodiments, the selective etching includes SiGe oxidation followed by a $SiGeO_x$ removal. For example, the oxidation may be provided by an oxygen-containing cleaning process and then $SiGeO_x$ removed by the fluoride-based plasma (e.g., $NF_3$ plasma) that selectively etches $SiGeO_x$ at a faster etch rate than it etches Si. Moreover, because oxidation rate of Si is much lower (sometimes 30 times lower) than oxidation rate of SiGe (or Ge), the channel layers 124 is not significantly etched by the process of laterally recessing the sacrificial layers 122. As a result, the channel layers 124 laterally extend past opposite end surfaces of the sacrificial layers 122.

In absence of the multi-layer sacrificial layer, as a single-layered sacrificial layer (e.g., SiGe) is used between the channel layers, the selective etching process may result in an angled or curved recessed end surface of the sacrificial layer due to the differences in the etching rate among various facets of silicon germanium (e.g., {110} and {111}). For example, for the fluoride-based gas, the relative etching rates among silicon germanium facets are {110}>{111}. The recessed end surface of the sacrificial layer may have a recessed end surface with two slanted walls that extend along {111} facets of the sacrificial layer. This shape may result in an inner spacer formed subsequently have a convex shape, which may provide poor structural isolation during channel release, and an etch process in the channel release step may etch the source/drain epitaxial structure.

In some embodiments of the present disclosure, a multi-layer sacrificial layer 122 is used between the channel layers. The differences in the etching rate among various facets of silicon germanium (e.g., {110} and {111}) is compensated by the different composition of the multi-layer sacrificial layer 122. For example, the middle layers 122m (e.g., $Si_yGe_{1-y}$) in the multi-layer sacrificial layer 122 is designed with a composition corresponding to a higher etch resistance, while the bottom and top layers 122b and 122t (e.g., $Si_xGe_{1-x}$) in multi-layer sacrificial layer 122 is designed with a composition corresponding to a lower etch resistance. As aforementioned, x is less than y. The middle epitaxial layers 122m may have a higher etch resistance to the etching process than that of the top and bottom epitaxial layers 122t and 122b. Thus, the middle layers 122m are etched at a slower rate than the bottom and top layers 122b and 122t, thereby compensating the recessed end surface with two slanted walls extending along {111} facets due to the relative etching rates among silicon germanium facets. Through the configuration, once the lateral etching is complete, widths of the epitaxial layers 122b and 122t may be substantially same as a width of the epitaxial layer 122m, and the widths 122W of the epitaxial layers 122b, 122m, and 122t may be less than a width 124W of the channel layer 124. The recessed end surface of the sacrificial layer 122 may have a straight sidewall extending along {110} facets of the sacrificial layer 122. Thus, the inner spacer formed subsequently (e.g., the spacers 182 in FIG. 9A) may include a uniform shape to provide a good structural isolation during channel release, and protect the source/drain epitaxial structure from being etched over during the etch process in the channel release step.

Figure 7B:
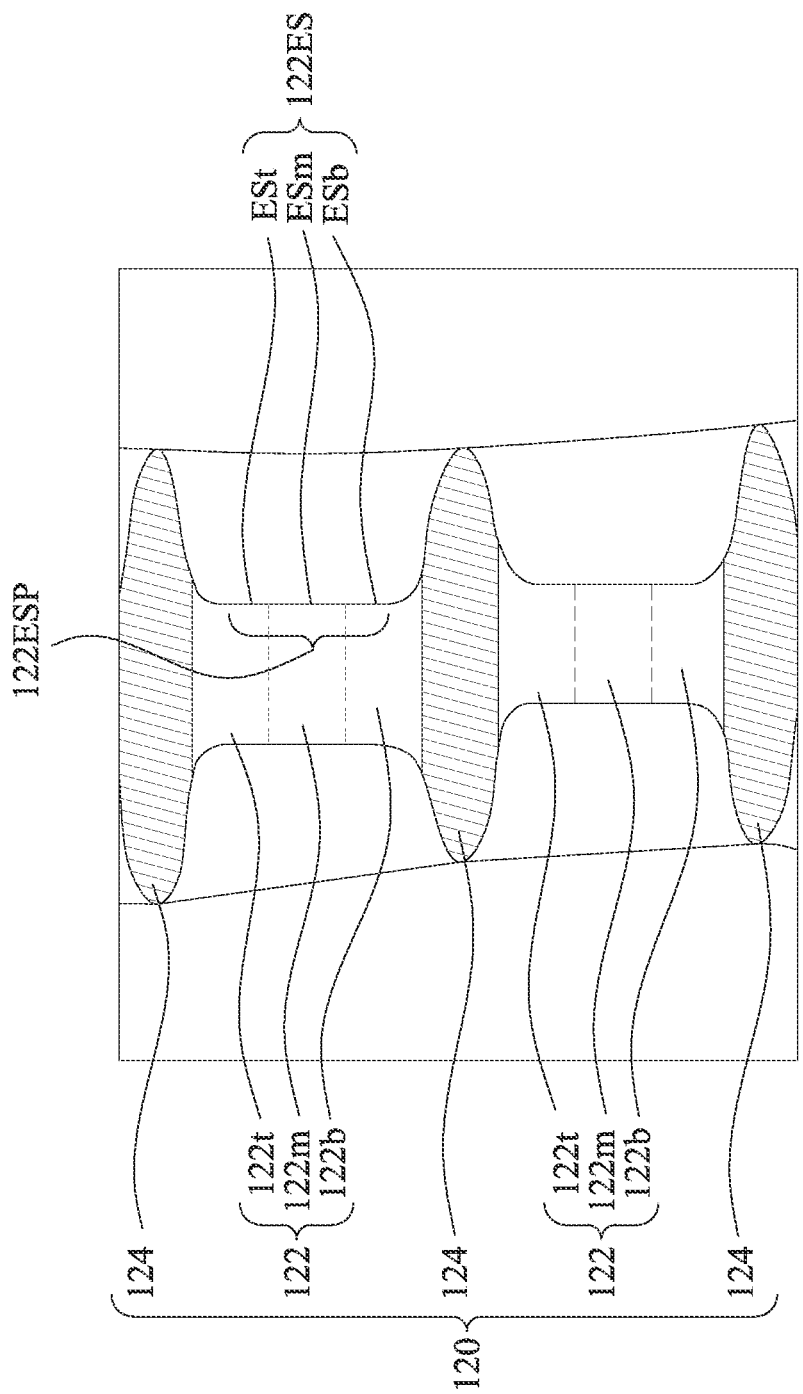

FIG. 7B shows an enlarged cross-sectional view of the semiconductor device. By compensating the relative facet etching rates through the composition tuning, the end surfaces 122ES of the sacrificial layers 122 may have a straight portion 122ESP misaligned with the end surface 122ES of the channel layer 124. The end surfaces ESb, ESm, ESt of the first to third epitaxial layers 122b, 122m, and 122t form the straight portion 122ESP. The straight portion 122ESP may be substantially vertical to a top surface of the semiconductor substrate 110 or a lengthwise direction of the channel layers 124. In some embodiments, the straight portion 122ESP of the end surface 122ES of the sacrificial layers 122 may extend along the {110} facet of the sacrificial layers 122. As the layers 122 and 124 are epitaxially grown on the semiconductor substrate 110, the layers 122 and 124 may follow the crystal orientation of the semiconductor substrate 110, such that the straight portion 122ESP of the end surface 122ES of the sacrificial layers 122 may be substantially parallel with {110} facet of the channel layer 124 or {110} facet of the semiconductor substrate 110. In some embodiments, a height of the straight portion 122ESP of the end surface 122ES of the sacrificial layers 122 may be greater than a thickness of the middle epitaxial layer 122m.

Figure 8:
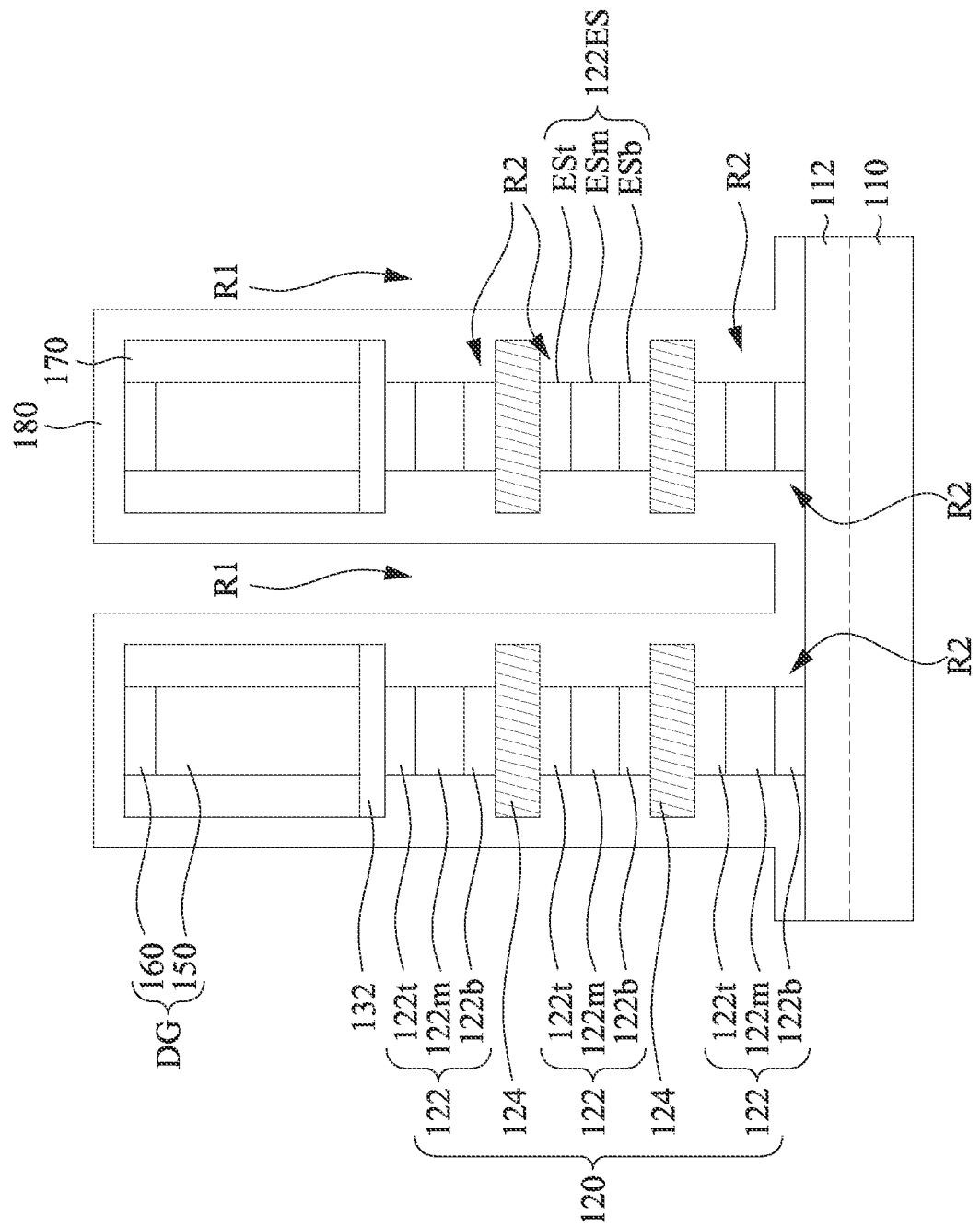

Reference is made to FIG. 8. An inner spacer material layer 180 is formed to fill the lateral/sidewall recesses R2. The inner spacer material layer 180 may be a low-K dielectric material, such as $SiO_x$, SiON, SiOC, SiN, SiCN, or SiOCN, and may be formed by a suitable deposition method, such as ALD. The inner spacer material layer 180 may include a single layer or multiple layers. The inner spacer material layer 180 may be on and in contact with the recessed end surfaces 122ES of the sacrificial layers 122 (including the end surfaces ESb, ESm, and ESt of the epitaxial layers 122b, 122m, and 122t).

Figure 9A:
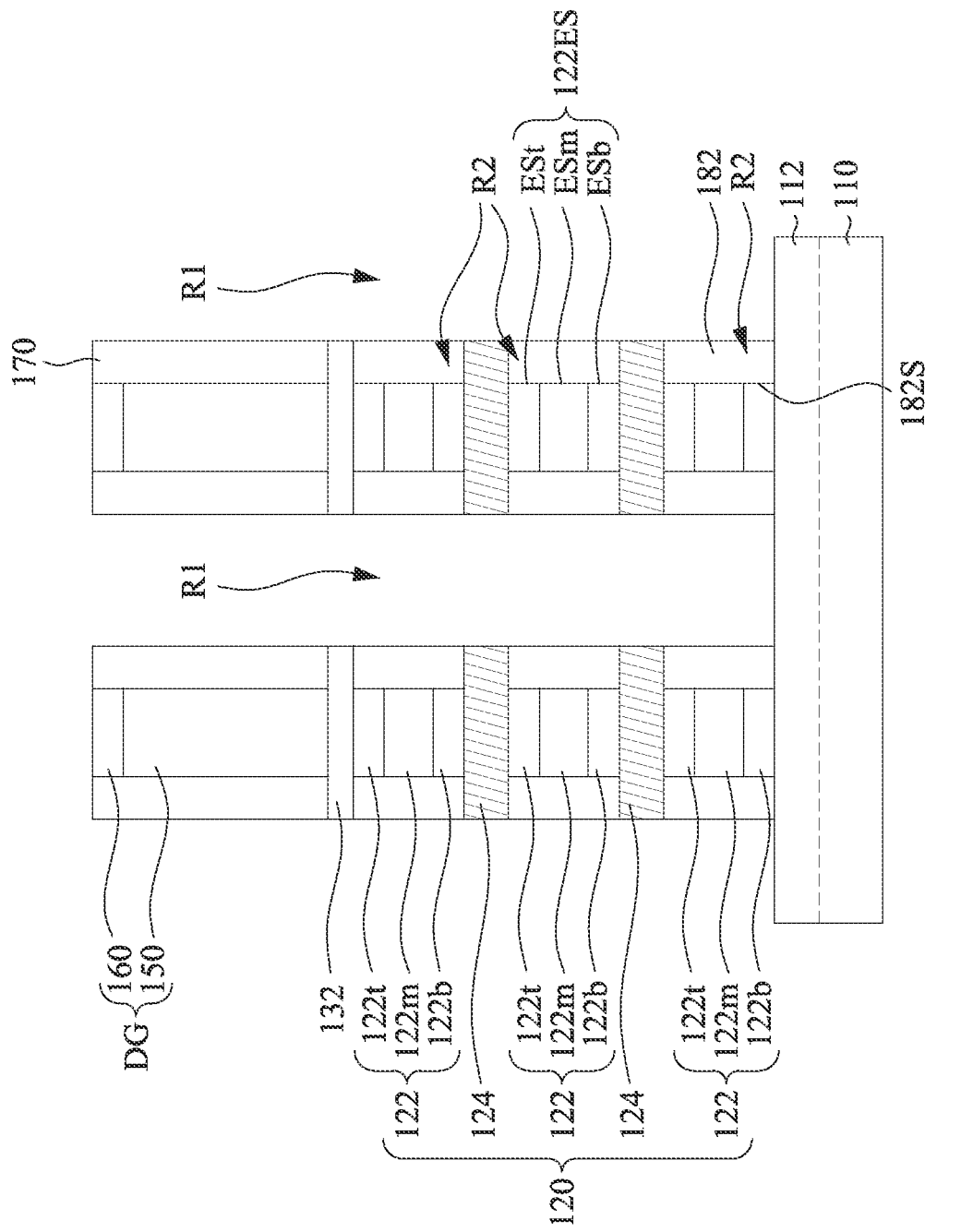

Reference is made to FIG. 9A. After the deposition of the inner spacer material layer 180, an anisotropic etching process may be performed to trim the deposited inner spacer material layer 180, such that only portions of the deposited inner spacer material layer 180 that fill the lateral/sidewall recesses R2 left by the lateral etching of the sacrificial layers 1122 are left. After the trimming process, the remaining portions of the deposited inner spacer material layer 180 are denoted as inner spacers 182. The inner spacers 182 may be formed in the lateral/sidewall recesses R2. Stated differently, the inner spacers 182 may be formed on opposite end surfaces of the laterally recessed sacrificial layers 122. The inner spacers 182 may serve to isolate metal gates from source/drain regions formed in subsequent processing. In the example of FIG. 9A, sidewalls of the inner spacers 182 are aligned with sidewalls of the channel layers 124.

Figure 9B:
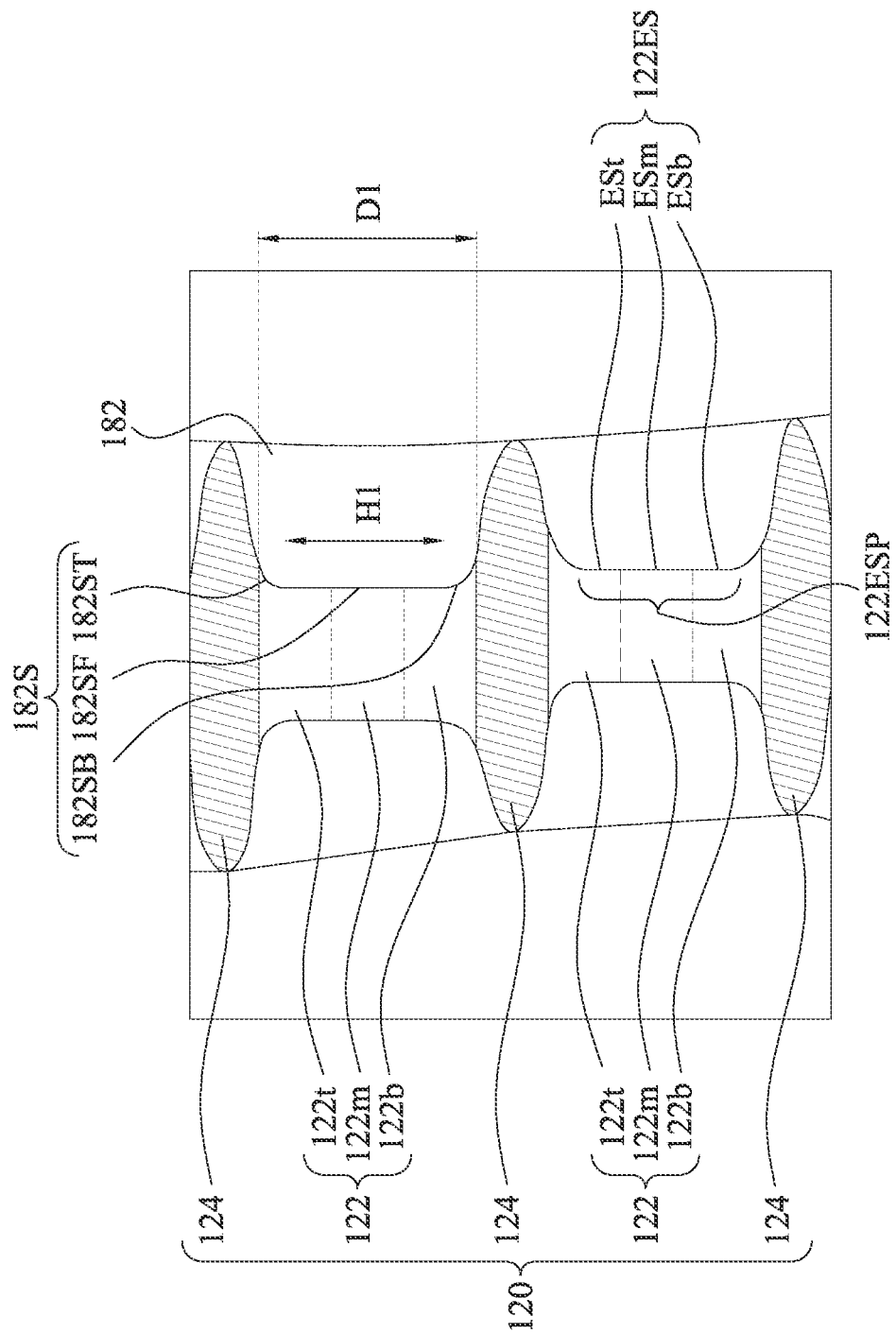

FIG. 9B shows an enlarged cross-sectional view of the semiconductor device. The inner spacer 182 has a sidewall 182S adjoining the first to third epitaxial layers 122b, 122m, and 122t. In some embodiments, the sidewall 182S has a substantially straight portion 182SF in contact with the substantially straight surface (e.g., the portion 122ESP) of the sacrificial layers 122, a top curved portion 182ST connecting a top end of the straight portion 182SF to an upper channel layer 124, and a bottom curved portion 182SB connecting a bottom end of the straight portion 182SF to a lower channel layer 124. The straight portion 182SF may also be referred to as straight sidewalls, and the curved portion 182SB and 182ST may also be referred to as curved sidewalls in the context. The straight portion 182SF of the sidewall 182S of the inner spacers 182 may be substantially vertical to the top surface of the semiconductor substrate 110 or the lengthwise direction of the channel layers 124. Following the profile of the portion 122ESP of the sacrificial layers 122, the straight portion 182SF of the sidewall 182S of the inner spacer 182 may be substantially parallel with {110} facet of the channel layer 124 or {110} facet of the semiconductor substrate 110. In some embodiments, a height H1 of the straight portion 182SF of the sidewall 182S of the inner spacers 182 may be greater than one-third of a distance D1 between the upper and lower channel layers 124, or even greater than half the distance D1. In some further embodiments, with the configuration of the multi-layer sacrificial layer 124, a ratio of the height H1 of the straight portion 182SF to the distance D1 between the upper and lower channel layers 124 may be in a range from about 33% to about 99%, or in a range from about 50% to about 90%. In some embodiments where each of the layers 122b, 122m, 122t have a same thickness as that of the channel layers 124, a height of the sidewall 182S of the inner spacers 182 may be equal to three times the thickness of the channel layers 124, and the height H1 of the straight portion 182SF may be greater than about twice the thickness of the channel layers 124.

Figure 10A:
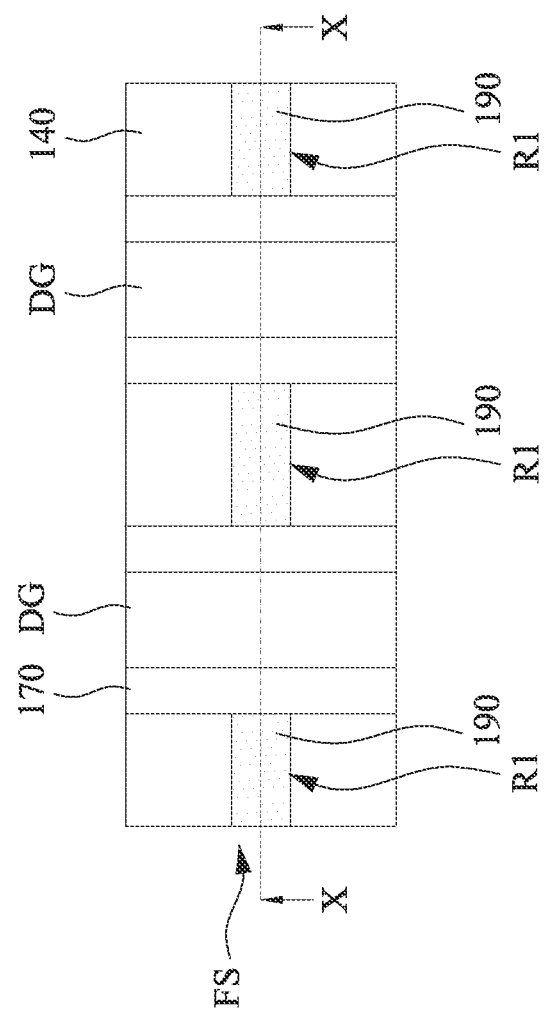
Figure 10B:
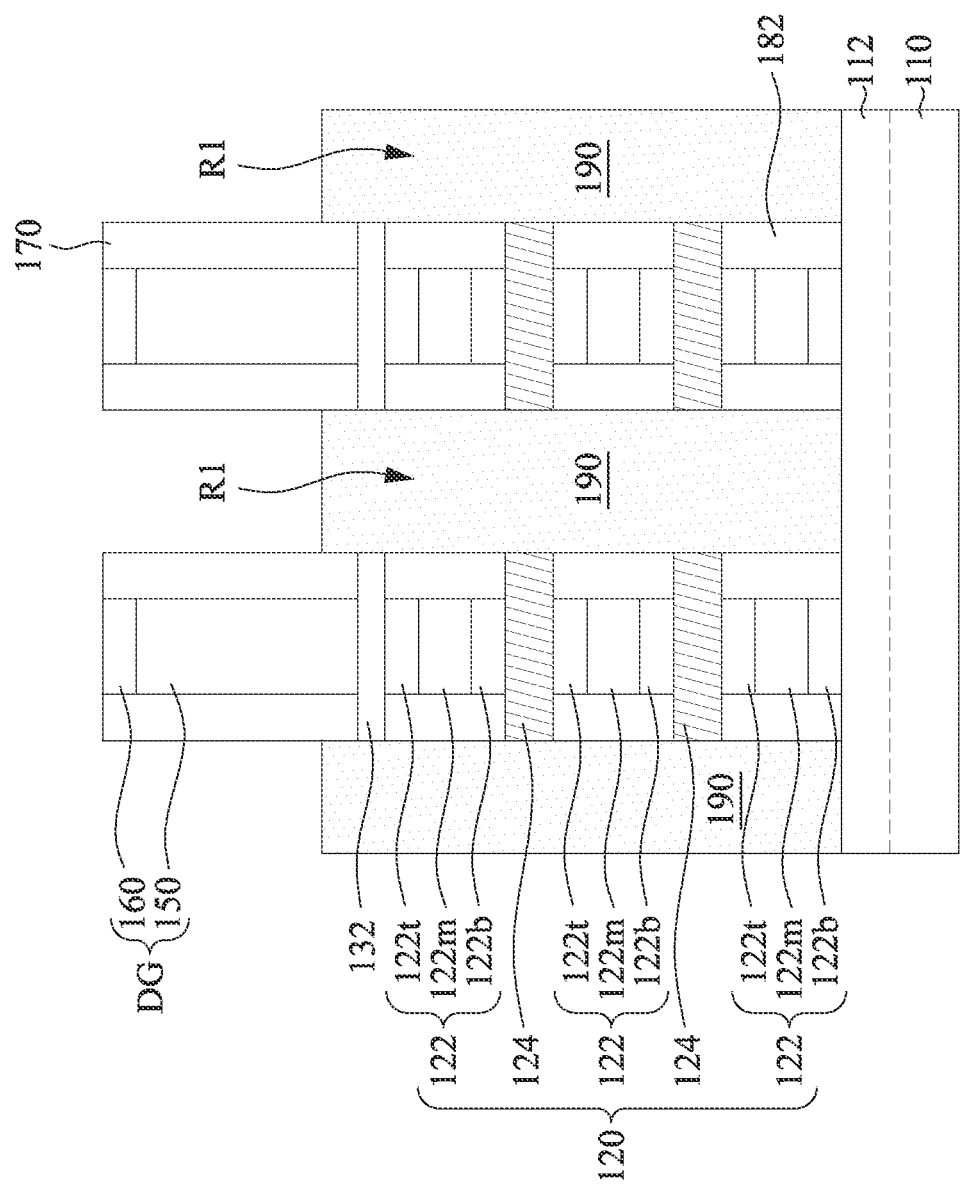

Reference is made to FIGS. 10A and 10B. Source/drain epitaxial structures 190 are formed in the recesses R1 on opposite sides of the channel layers 124 and on opposite sides of the dummy gate structure DG. In some embodiments, the source/drain epitaxial structures 190 may include Ge, Si, GaAs, AlGaAs, SiGe, GaAsP, SiP, or other suitable material. The source/drain epitaxial structures 190 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 190 are not in-situ doped, an implantation process (i.e., a junction implant process) is performed to dope the source/drain epitaxial structures 190. The source/drain epitaxial structures 190 may be formed by performing an epitaxial growth process that provides an epitaxial material on the exposed surfaces of the fins FS. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the substrate portion 112 and the channel layers 124 of the fins FS.

Figure 11A:
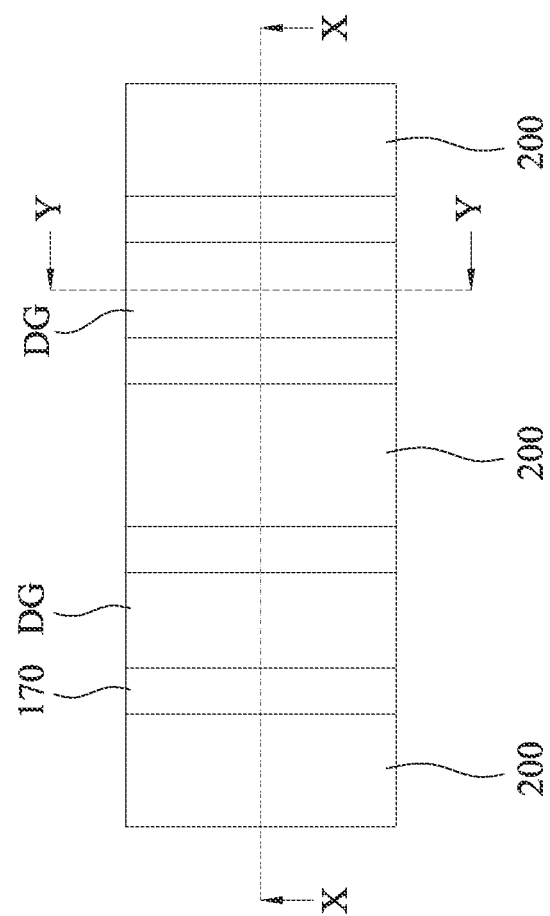
Figure 11B:
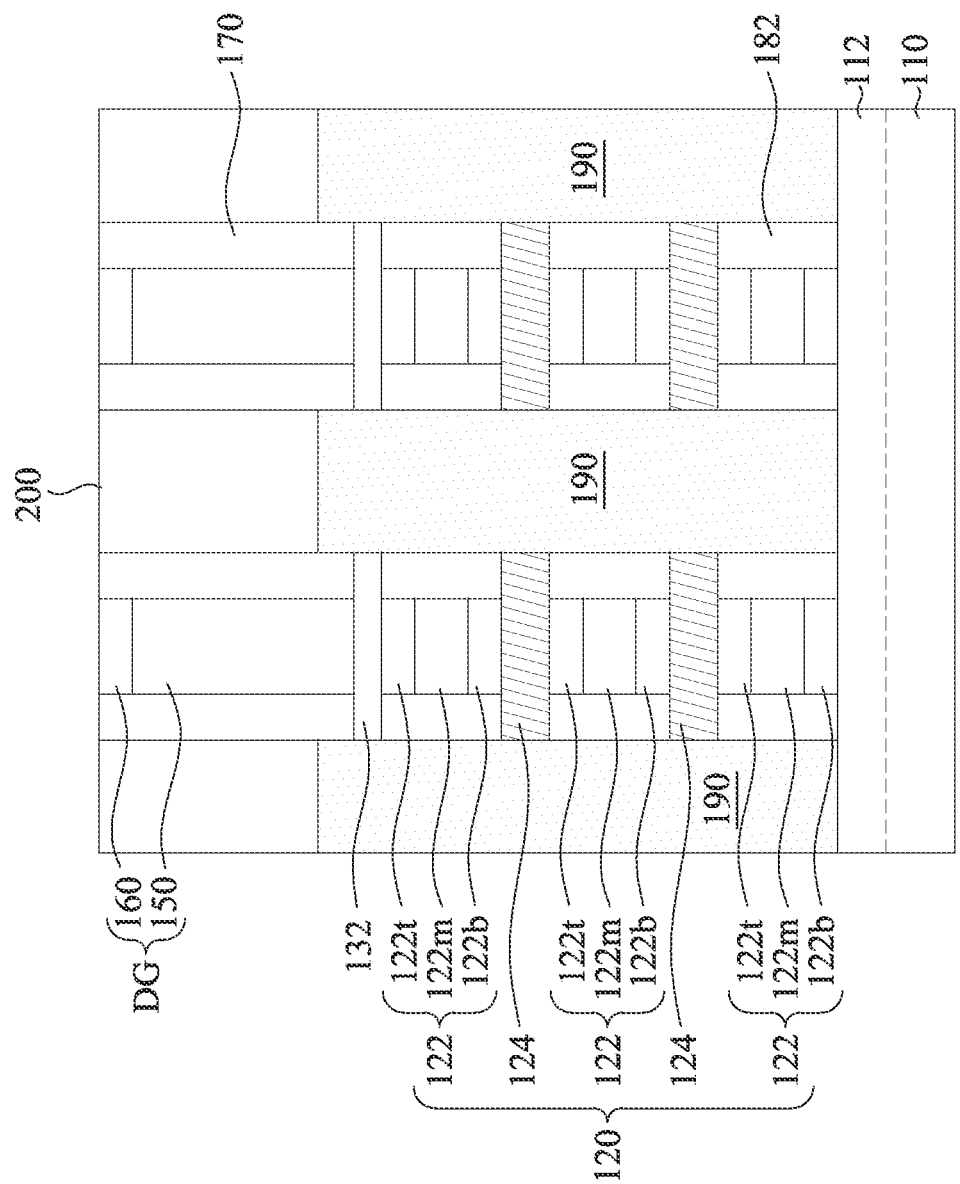

Reference is made to FIGS. 11A and 11B. A dielectric material 200 is formed over the substrate 110 and filling the space between the dummy gate structures DG. In some embodiments, the dielectric material 200 includes a contact etch stop layer (CESL) 2 and an interlayer dielectric (ILD) layer formed in sequence. In some examples, the CESL includes a silicon nitride layer, silicon oxide layer, a silicon oxynitride layer, and/or other suitable materials having a different etch selectivity than the ILD layer. The CESL may be formed by plasma-enhanced chemical vapor deposition (PECVD) process and/or other suitable deposition or oxidation processes. The ILD layer is then deposited over the CESL. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer may be deposited by a PECVD process or other suitable deposition technique. In some embodiments, after formation of the ILD layer, the semiconductor device may be subject to a high thermal budget process to anneal the ILD layer. After depositing the ILD layer, a planarization process may be performed to remove excessive materials of the ILD layer. For example, a planarization process includes a chemical mechanical planarization (CMP) process which removes portions of the ILD layer and the CESL layer overlying the dummy gate structures DG and planarizes a top surface of the semiconductor device.

Figure 12A:
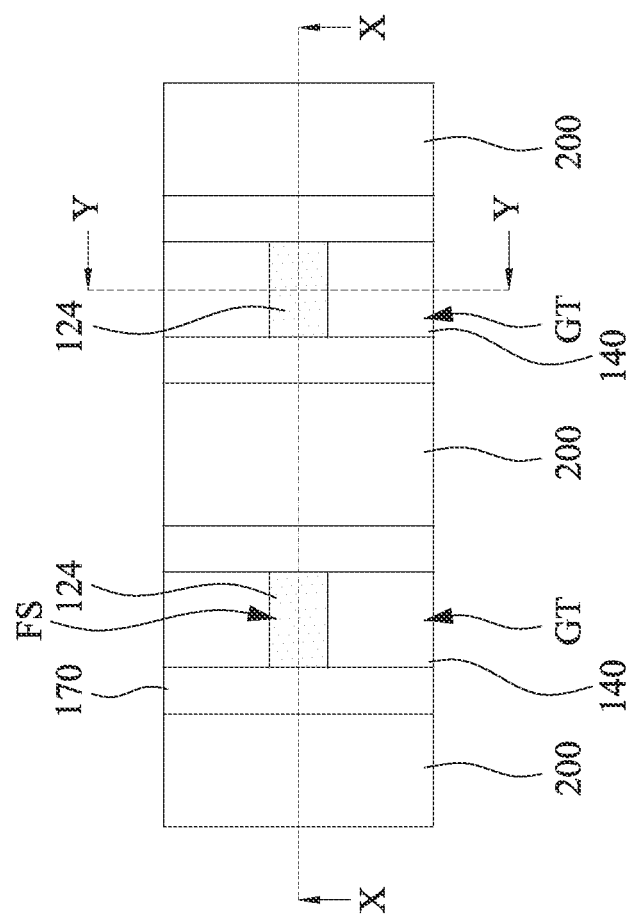
Figure 12B:
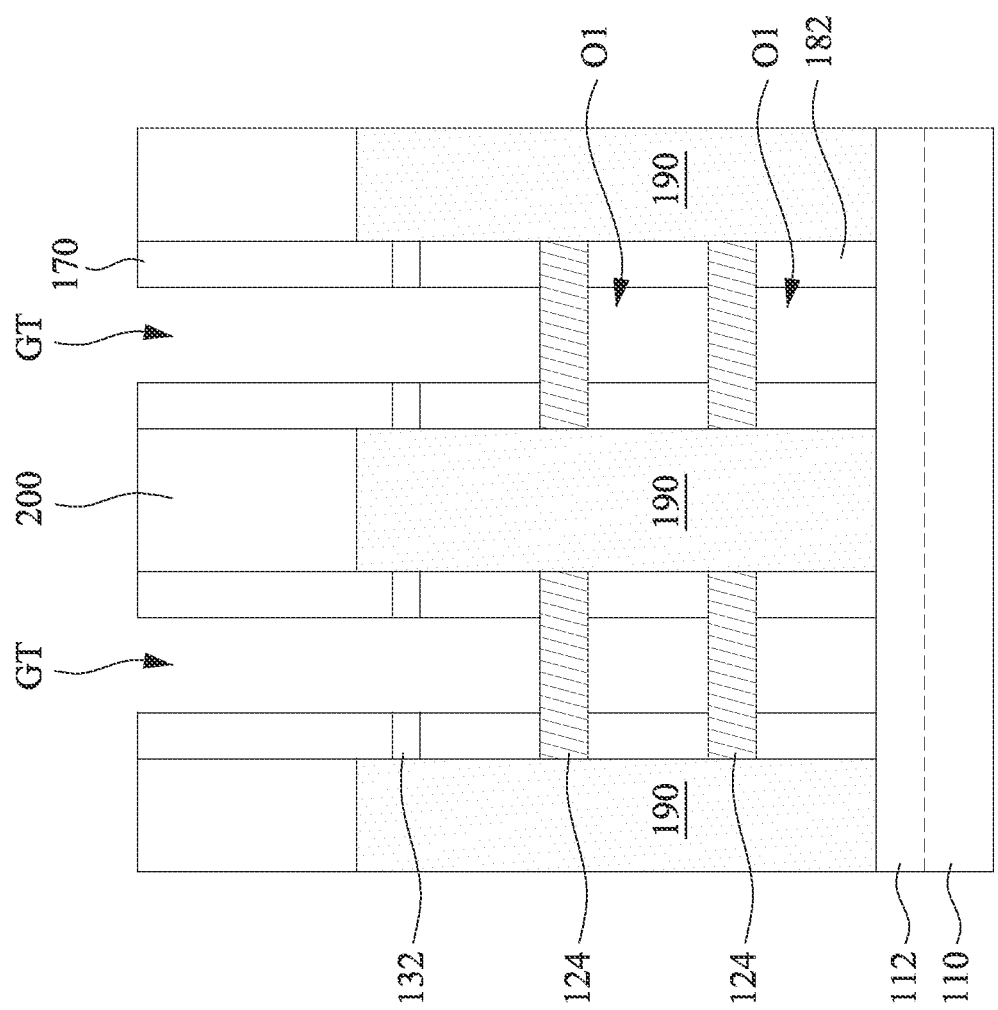
Figure 12C:
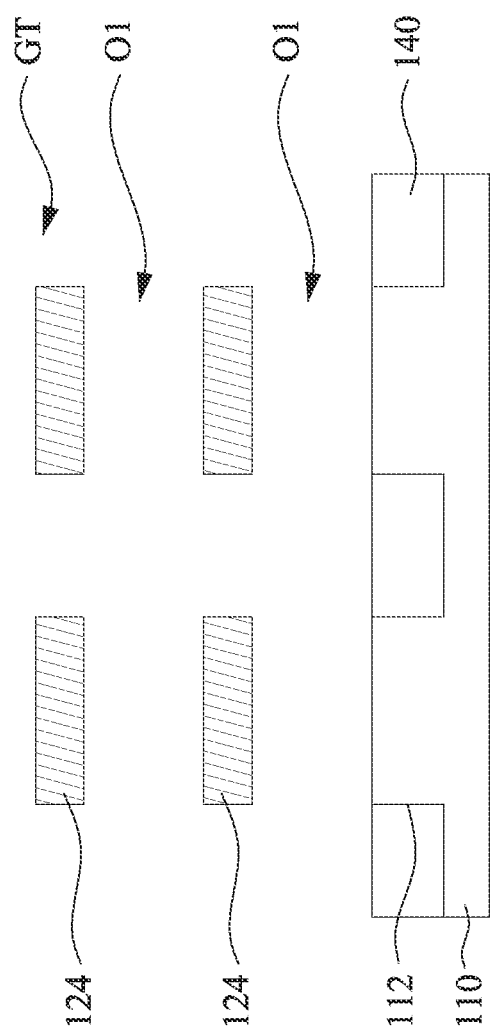

FIG. 12A-13D shows a gate replacement process. The dummy gate structure DG and the sacrificial layer 122 are replaced with a high-k/metal gate structure GS. Reference is made to FIGS. 12A-12C. The dummy gate structures DG (referring to FIGS. 11A and 11B) are removed, followed by removing the sacrificial layers 122 (referring to FIG. 11B). In the illustrated embodiments, the dummy gate structures DG (referring to FIGS. 11A and 11B) are removed by using a selective etching process (e.g., selective dry etching, selective wet etching, or a combination thereof) that etches the materials in dummy gate structures DG (referring to FIGS. 11A and 11B) at a faster etch rate than it etches other materials (e.g., gate spacers 170, and/or the dielectric material 200), thus resulting in gate trenches GT between corresponding gate spacers 170, with the sacrificial layers 122 (referring to FIG. 11B) exposed in the gate trenches GT.

Figure 12D:
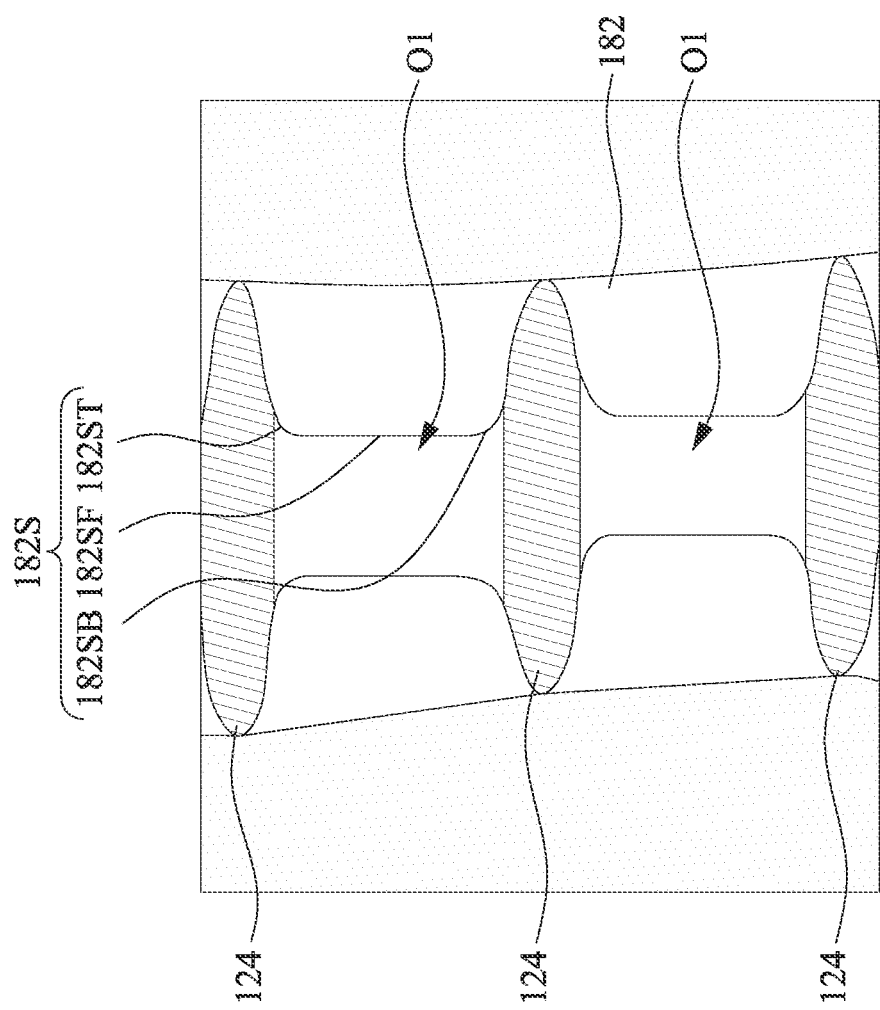

Subsequently, the sacrificial layers 122 (referring to FIG. 11B) in the gate trenches GT are etched by using another selective etching process that etches the sacrificial layers 122 at a faster etch rate than it etches the channel layers 124, thus forming openings/spaces O1 between neighboring channel layers 124. The openings/spaces O1 may expose the straight sidewall 182S of the inner spacer 182. In this way, the channel layers 124 become nanosheets suspended over the substrate 110 and between the source/drain epitaxial structures 190. This step is also called a channel release process. At this interim processing step, the openings/spaces O1 between nanosheets 124 may be filled with ambient environment conditions (e.g., air, nitrogen, etc). In some embodiments, the nanosheets 124 can be interchangeably referred to as nanowires, nanoslabs and nanorings, depending on their geometry. For example, in some other embodiments the channel layers 124 may be trimmed to have a substantial rounded shape (i.e., cylindrical) due to the selective etching process for completely removing the sacrificial layers 122 (referring to FIG. 11B). In that case, the resultant channel layers 124 can be called nanowires. FIG. 12D shows an enlarged cross-sectional view of the semiconductor device. In some embodiments, by the channel release process, the sidewall 182S of the inner spacer 182 (including the straight portion 182SF and the curved portions 182SB and 182ST) are exposed by the opening O1.

In some embodiments, the epitaxial layers 122b, 122m, and 122t of the sacrificial layers 122 (referring to FIG. 11B) are removed by using a selective dry etching process. In some embodiments, the epitaxial layers 122b, 122m, and 122t of the sacrificial layers 122 (referring to FIG. 11B) are SiGe and the channel layers 124 are silicon allowing for the selective removal of the epitaxial layers 122b, 122m, and 122t of the sacrificial layers 122 (referring to FIG. 11B). In some embodiments, the selective dry etching may use chloride-based gases, such as $CF_4$, $C_4F_8$, the like, or the combination thereof. In some embodiments, the selective removal includes SiGe oxidation followed by a $SiGeO_x$ removal. For example, the oxidation may be provided by $O_2$ plasma and then $SiGeO_x$ removed by the chloride-based plasma (e.g., $CF_4/C_4F_8$ plasma) that selectively etches $SiGeO_x$ at a faster etch rate than it etches Si, and stops on SiGe. The steps of SiGe oxidation and $SiGeO_x$ removal may be repeated until a desired amount of the sacrificial layer 122 is laterally removed. Moreover, because oxidation rate of Si is much lower (sometimes 30 times lower) than oxidation rate of SiGe, the channel layers 124 may remain substantially intact during the channel release process.

Figure 13A:
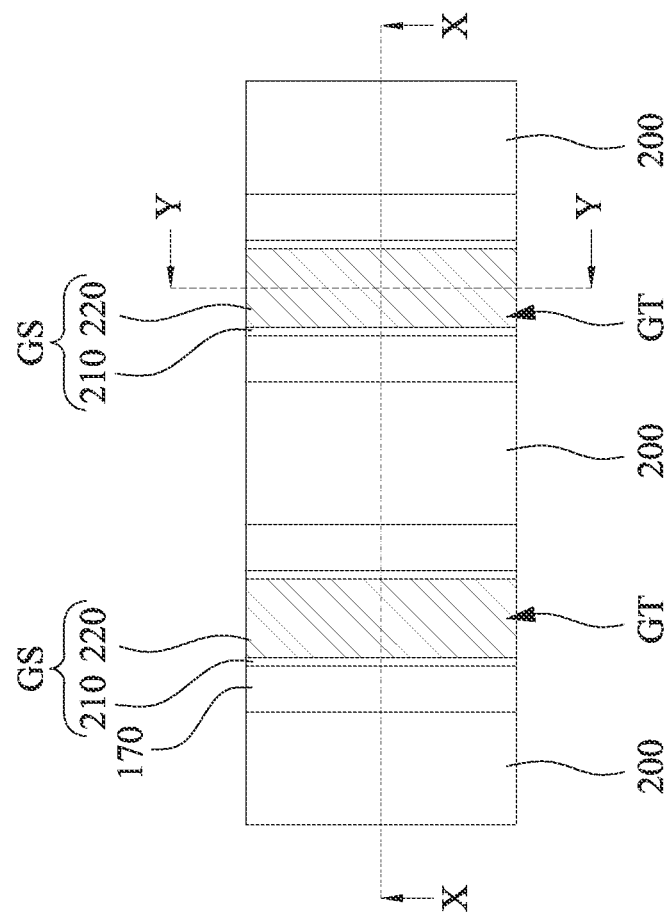
Figure 13B:
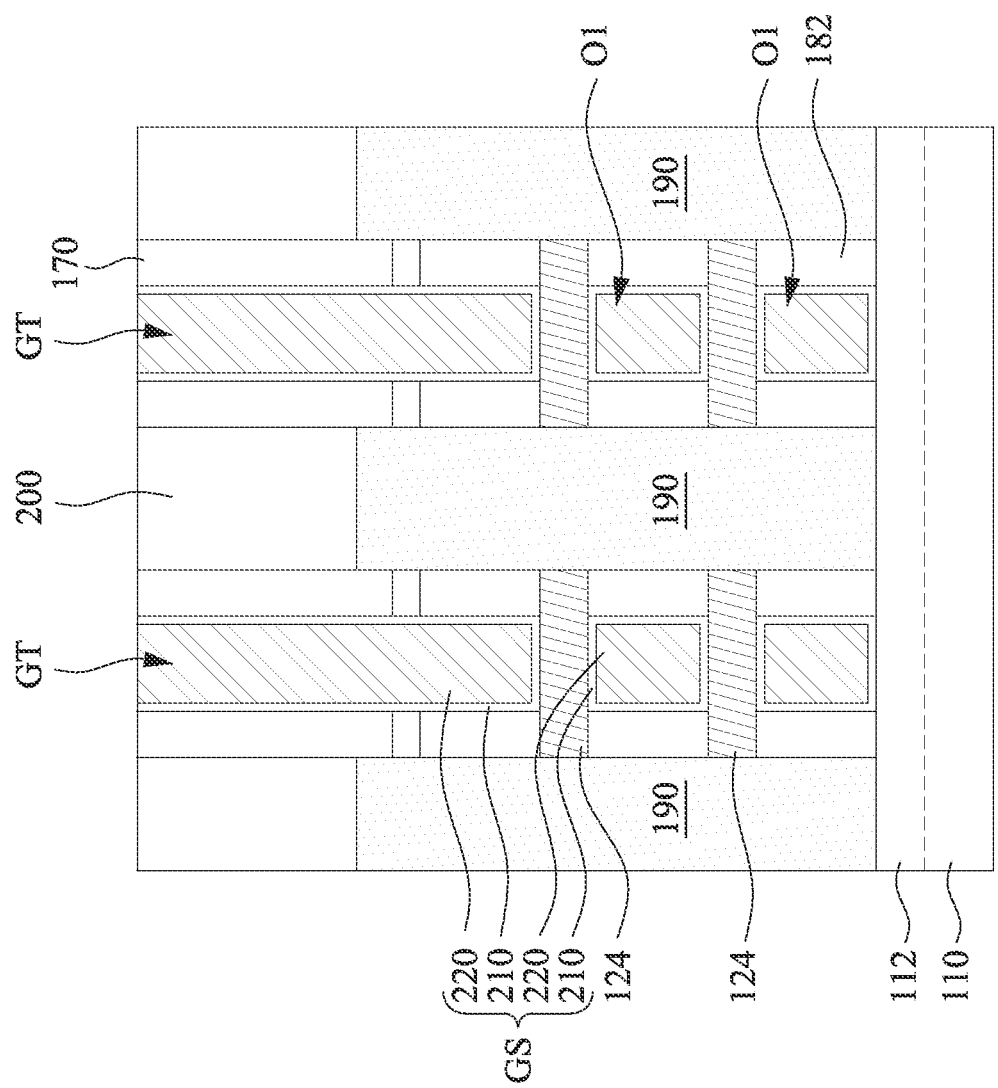
Figure 13C:
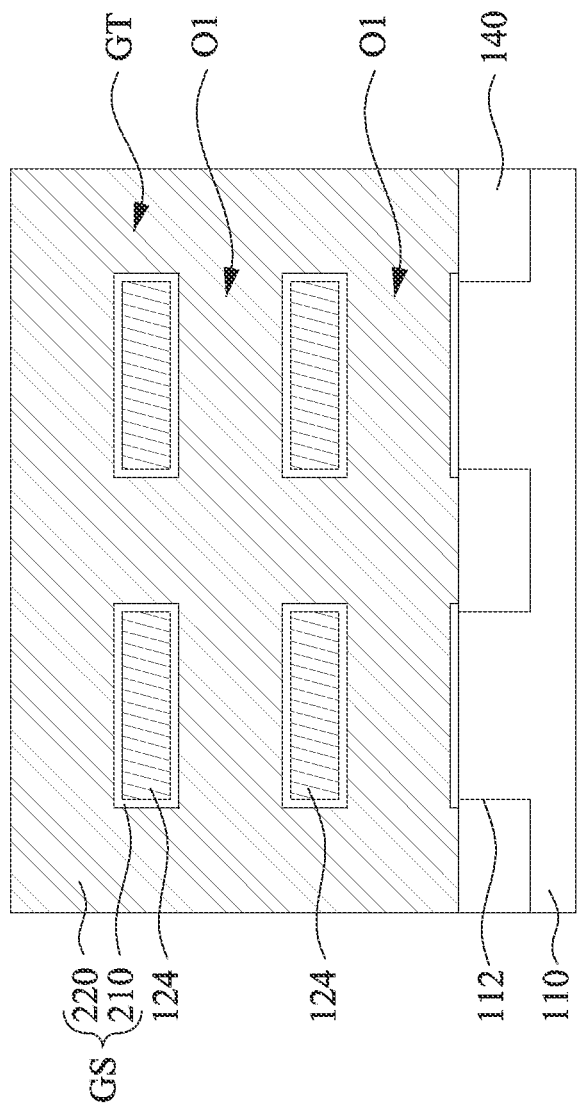

Reference is made to FIGS. 13A-13C. Replacement gate structures GS are respectively formed in the gate trenches GT to surround each of the nanosheets 124 suspended in the gate trenches GT. The gate structures GS may be final gates of GAA FETs. The final gate structure may be a high-k/metal gate stack, however other compositions are possible. In some embodiments, each of the gate structures GS forms the gate associated with the multi-channels provided by the plurality of nanosheets 124. For example, the high-k/metal gate structures GS are formed within the openings/spaces O1 provided by the release of nanosheets 124. The high-k/metal gate structures GS may be between the nanosheets 124 and surrounded by the inner spacers 182.

In various embodiments, the high-k/metal gate structure GS includes a gate dielectric layer 210 formed around the nanosheets 124 and a gate metal layer 220 formed around the dielectric layer 210 and filling a remainder of gate trenches GT. Formation of the high-k/metal gate structures GS may include one or more deposition processes to form various gate materials, followed by a CMP processes to remove excessive gate materials, resulting in the high-k/metal gate structures GS having top surfaces level with a top surface of the dielectric material 200. Thus, transistors (e.g., GAA FET) are formed, and the high-k/metal gate structure GS surrounds each of the nanosheets 124, and thus is referred to as a gate of the transistors (e.g., GAA FET).

The gate dielectric layer 210 may include an interfacial layer and a high-k gate dielectric layer over the interfacial layer. In some embodiments, the interfacial layer is silicon oxide formed on exposed surfaces of semiconductor materials in the gate trenches GT by using, for example, thermal oxidation, chemical oxidation, wet oxidation or the like. As a result, surface portions of the nanosheets 124 and the substrate 110 exposed in the gate trenches GT are oxidized into silicon oxide to form interfacial layer. In some embodiments, the high-k gate dielectric layer includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 220 includes one or more metal layers. For example, the gate metal layer 220 may include one or more work function metal layers stacked one over another and a fill metal filling up a remainder of gate trenches GT. The one or more work function metal layers in the gate metal layer 220 provide a suitable work function for the high-k/metal gate structures GS. For an n-type GAA FET, the gate metal layer 220 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten (W), and/or other suitable materials. On the other hand, for a p-type GAA FET, the gate metal layer 220 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 220 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 13D:
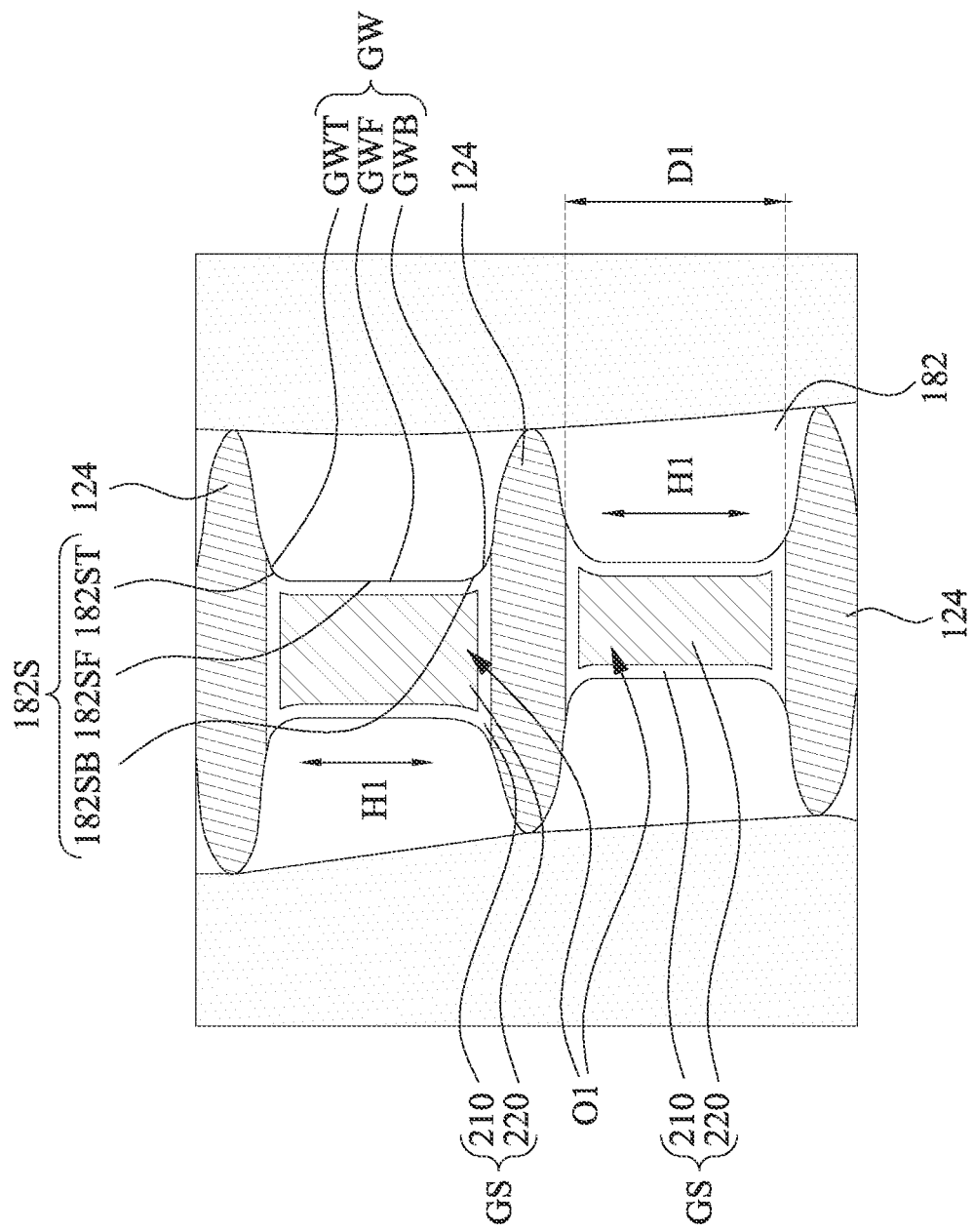

FIG. 13D shows an enlarged cross-sectional view of the semiconductor device. In some embodiments, the high-k/metal gate structures GS (e.g., the gate dielectric layer 210) is in contact with the sidewall 182S of the inner spacer 182 (including the straight portion 182SF and the curved portions 182SB and 182ST). The inner spacer 182 may space the gate structure GS apart from the source/drain epitaxial structures 190. According to the profile of the sidewall 182S of the inner spacer 182, a sidewall GW of the high-k/metal gate structures GS may have a straight portion GWF, a bottom curved portion GWB, and a top curved portion GWT. The straight portion GWF may also be referred to as straight sidewalls, and the curved portion GWB and GWT may also be referred to as curved sidewalls in the context. The straight portion GWF of the sidewall GW of the high-k/metal gate structures GS may be substantially vertical to a lengthwise direction of the channel layers 124. Following the profile of the straight portion 182SF of the sidewall 182S of the inner spacer 182, the straight portion GWF of the sidewall GW of the high-k/metal gate structures GS may be substantially parallel with {110} facet of the channel layer 124 or {110} facet of the semiconductor substrate 110. As the profile of the straight portion 182SF of the sidewall 182S of the inner spacer 182, in some embodiments, a height H1 of the straight portion GWF of the sidewall GW of the high-k/metal gate structures GS may be greater than one-third of the distance D1 between the upper and lower channel layers 124, or even greater than half the distance D1. In some further embodiments, a ratio of the height H1 of the straight portion GWF of the sidewall GW of the high-k/metal gate structures GS to the distance D1 between the upper and lower channel layers 124 may be in a range from about 33% to about 99%, or about 50% to about 90%. In some embodiments where each of the layers 122b, 122m, 122t have a same thickness as that of the channel layers 124, a height of the sidewall GW of the high-k/metal gate structures GS may be equal to three times the thickness of the channel layers 124, and the straight portion GWF of the sidewall GW may be greater than about twice the thickness of the channel layers 124.

Figure 14:
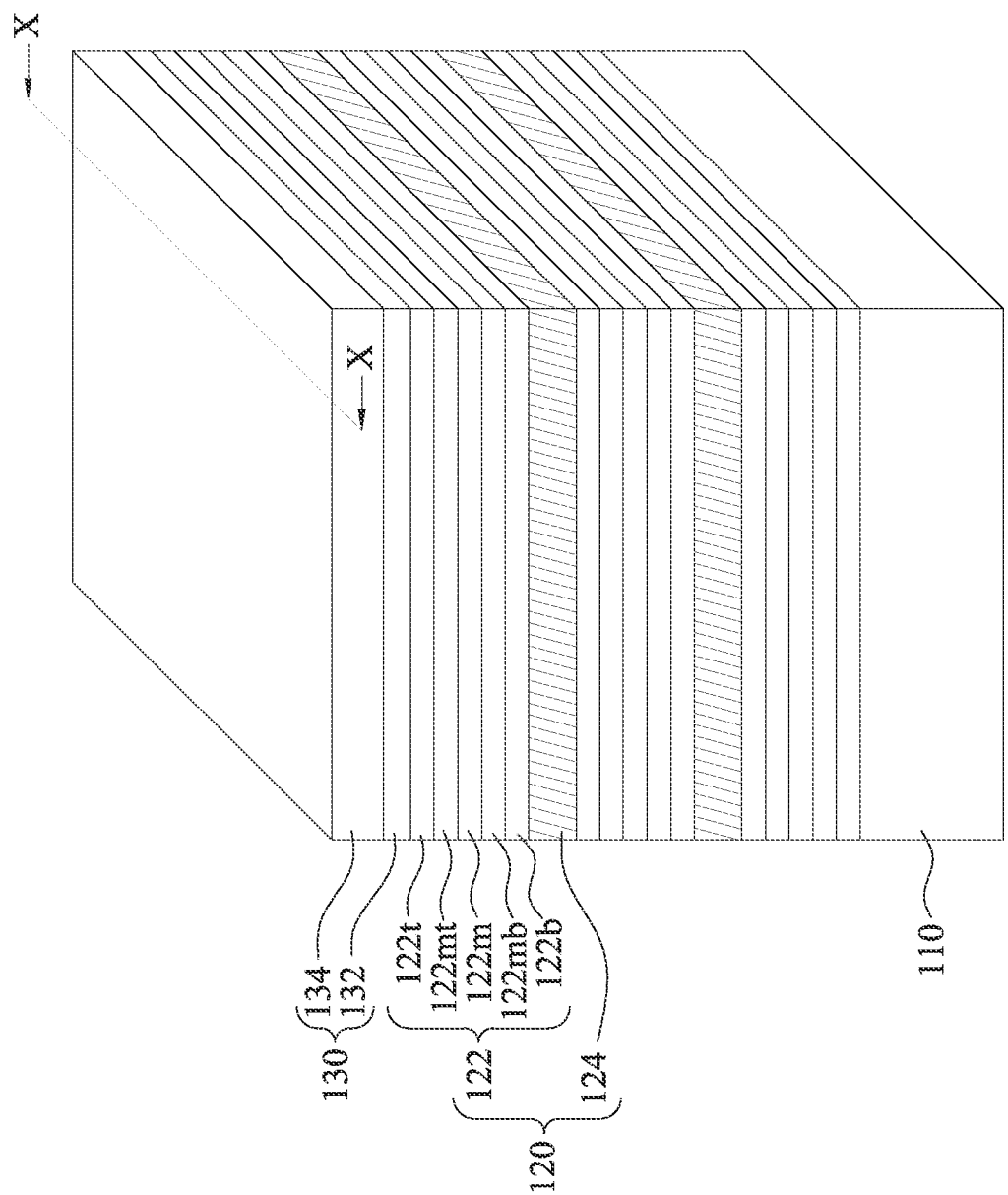
FIGS. 14-16 illustrate schematic views of intermediate stages in the manufacture of a semiconductor device in accordance with some embodiments of the present disclosure.
Figure 15:
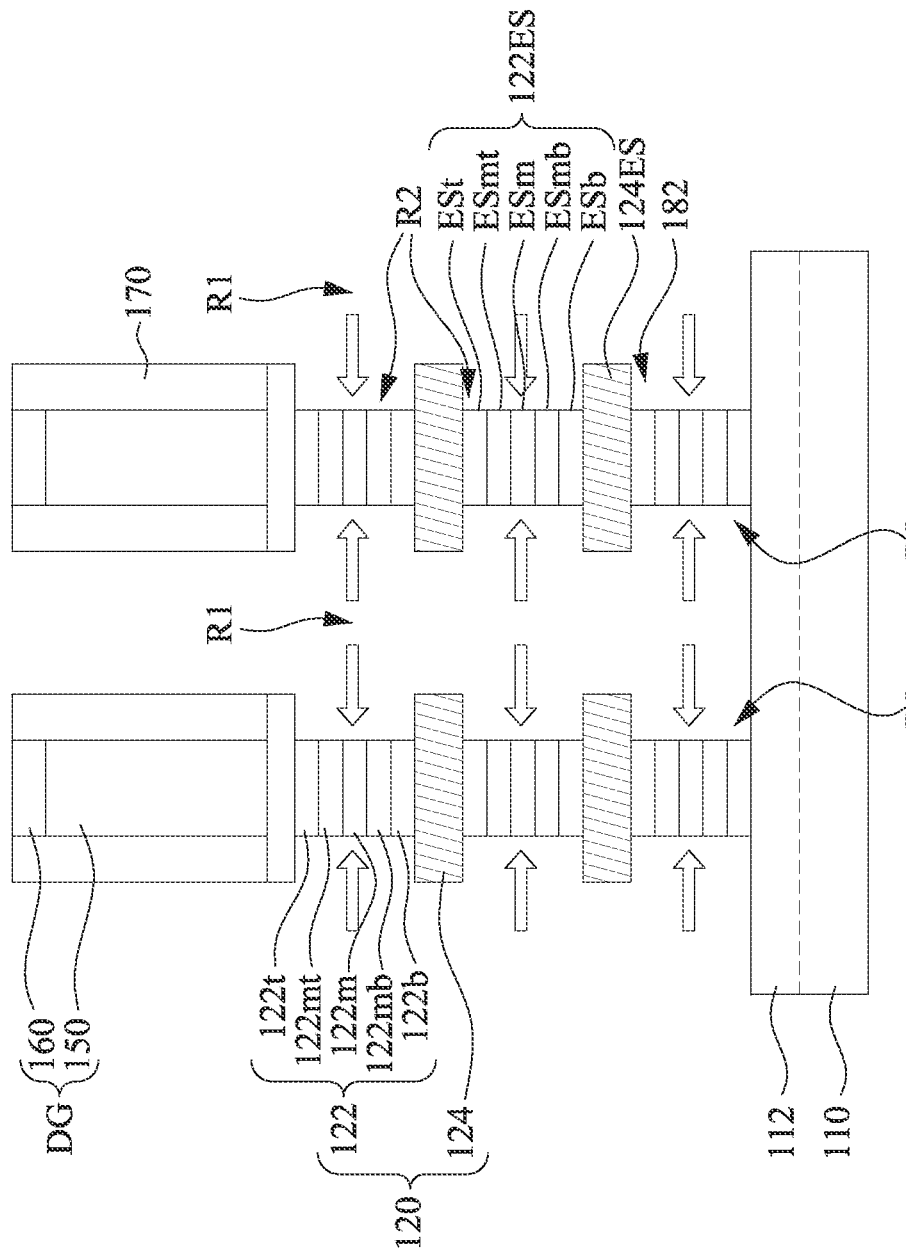
Figure 16:
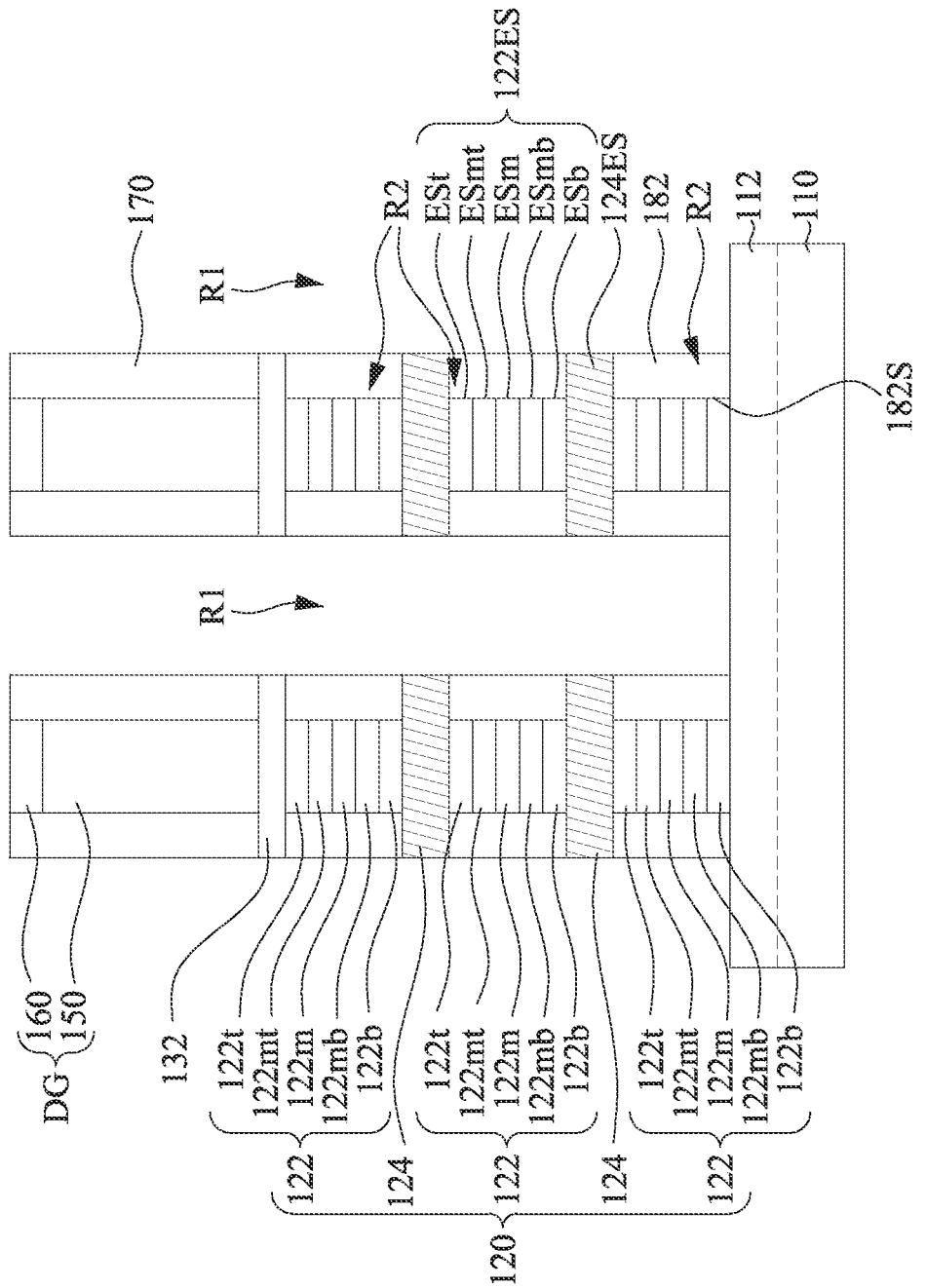

FIGS. 14-16 illustrate schematic views of intermediate stages in the manufacture of a semiconductor device in accordance with some embodiments of the present disclosure. Details of the present embodiments are similar to those illustrated in the embodiments of FIGS. 1-13D, except that the sacrificial layer 124 comprises five epitaxial layers 122b, 122mb, 122m, 122mt, 122t. FIG. 14 is a schematic perspective view of the semiconductor device at various stages in accordance with some embodiments. FIGS. 15 and 16 are cross-sectional views of the semiconductor device (e.g., taken along line X-X in FIG. 14) at various manufacturing stages in accordance with some embodiments. It is understood that additional steps may be provided before, during, and after the steps shown in FIGS. 14-16, and some of the steps described below can be replaced or eliminated for additional embodiments of the method. The order of the operations/processes may be interchangeable.

Reference is made to FIG. 14. As aforementioned, the epitaxial stack 120 includes sacrificial layers 122 interposed by channel layers 124. In the present embodiments, each of the sacrificial layers 122 may be a stack layer including a first epitaxial layer 122b, a second epitaxial layer 122mb, a third epitaxial layer 122m, a fourth epitaxial layer 122mt, and a fifth epitaxial layer 122t. The first to fifth epitaxial layers 122b, 122mb, 122m, 122mt, 122t, and the channel layers 124 may have different compositions. In some embodiments, for example, for forming an n-type device, a Si concentration in the third epitaxial layer 122m is greater than a Si concentration in the epitaxial layers 122b, 122mb, 122mt and 122t but less than a Si concentration in the channel layers 124, and the Si concentration in the epitaxial layers 122mb and 122mt is greater than the Si concentration in the epitaxial layers 122b and 122t. Stated differently, in the embodiments, for forming an n-type device, a Ge concentration in the third epitaxial layer 122m is less than a Ge concentration in the epitaxial layers 122b, 122mb, 122mt and 122t but greater than a Ge concentration in the channel layers 124, and the Ge concentration in the epitaxial layers 122mb and 122mt is less than the Ge concentration in the epitaxial layers 122b and 122t. For example, the first and fifth epitaxial layers 122b and 122t are $Si_xGe_{1-x}$, the second and fourth epitaxial layers 122mb and 122mt are $Si_mGe_{1-m}$, the third epitaxial layers 122m is $Si_yGe_{1-y}$, and the channel layers 124 are $Si_zGe_{1-z}$, in which x, y, z, m are in a range from 0 to 1, and z>y >m >x. In some embodiments, the epitaxial layers 122b, 122mb, 122m, 122mt and 122t are SiGe, and the channel layers 124 are silicon (Si). However, other embodiments are possible including those that provide for the compositions having different oxidation rates and/or etch selectivity. In some embodiments, the epitaxial layers 122 include SiGe and where the channel layers 124 include Si, the Si oxidation rate of the channel layers 124 is less than the SiGe oxidation rate of the middle epitaxial layers 122m, and the SiGe oxidation rates of the first to fifth epitaxial layers 122b, 122mb, 122m, 122mt and 122t decreases from a middle layer (e.g., the third epitaxial layer 122m) toward the top and bottom layers (e.g., the epitaxial layers 122t and 122b). By way of example, epitaxial growth of the layers of the stack 120 may be performed by a molecular beam epitaxy (MBE) process, a metalorganic chemical vapor deposition (MOCVD) process, and/or other suitable epitaxial growth processes.

The epitaxial layers 122b, 122mb, 122m, 122mt, 122t may have a same thickness in some embodiments. In some alternative embodiments, the epitaxial layers 122m may have a thickness greater or less than a thickness of the epitaxial layers 122b 122mb, 122mt, and 122t, and the epitaxial layers 122b 122mb, 122mt, and 122t may have a same thickness or different thicknesses.

Reference is made to FIG. 15. As the aforementioned lateral recessing step shown in FIG. 7A, the sacrificial layers 122 are laterally or horizontally recessed by using suitable selective etching process, resulting in lateral/sidewall recesses R2 each vertically between corresponding channel layers 124. The arrows in FIG. 15 indicate the direction of the laterally etching. For example, end surfaces 122ES of the sacrificial layers 122 (including the end surfaces ESb, ESmb, ESm, ESmt, and ESt of the epitaxial layers 122b, 122mb, 122m, 122mt, and 122t) are recessed by the selective etching process. The various compositions in epitaxial layers (e.g., $Si_xGe_{1-x}$ for the layers 122b and 122t, $Si_mGe_{1-m}$ for the layers 122mb and 122mt, $Si_yGe_{1-y}$ for the layers 122m, and $Si_xGe_{1-x}$ for the layers 124) result in different oxidation rates and/or etch selectivity, thereby facilitating the selective etching process. In some embodiments, a selective dry etching process is performed by using fluoride-based etchant gas, such as $NF_3$, $SF_6$, the like, or the combination thereof. The fluoride-based gas may etch SiGe at a faster etch rate than it etches Si. The channel layers 124 may have a higher etch resistance to the etching process than that of the bottom, middle, and top epitaxial layers 122b, 122m, and 122t. In some embodiments, the selective etching includes SiGe oxidation followed by a $SiGeO_x$ removal. For example, the oxidation may be provided by an oxygen-containing cleaning process and then $SiGeO_x$ removed by the fluoride-based plasma (e.g., $NF_3$ plasma) that selectively etches $SiGeO_x$ at a faster etch rate than it etches Si. Moreover, because oxidation rate of Si is much lower (sometimes 30 times lower) than oxidation rate of SiGe (or Ge), the channel layers 124 is not significantly etched by the process of laterally recessing the sacrificial layers 122. As a result, the channel layers 124 laterally extend past opposite end surfaces of the sacrificial layers 122.

The differences in the etching rate among various facets of silicon germanium (e.g., {110} and {111}) is compensated by the different composition of the multi-layer sacrificial layer 122. For example, the middle layers 122m are etched at a slower rate than the layers 122b, 122mb, 122mt, and 122t, and the layers 122mb and 122mt are etched at a slower rate than the layers 122b and 122t, thereby compensating the recessed end surface with two slanted walls extending along {111} facets due to the relative etching rates among silicon germanium facets. Through the configuration, the recessed end surface of the sacrificial layer 122 may have a straight sidewall extending along {110} facets of the sacrificial layer 122. Thus, the inner spacer formed subsequently (e.g., the spacers 182 in FIG. 16) may include a uniform shape to provide a good structural isolation during channel release, and protect the source/drain epitaxial structure from being etched over during the etch process in the channel release step.

Reference is made to FIG. 16. As the aforementioned inner space formation step shown in FIGS. 8 and 9A, the inner spacers 182 are formed on and in contact with the recessed end surfaces 122ES of the sacrificial layers 122 (including the end surfaces ESb, ESmb, ESm, ESmt, and ESt of the layers 122b, 122mb, 122m, 122mt, and 122t). The inner spacer 182 has a sidewall 182S adjoining the epitaxial layers 122b, 122mb, 122m, 122mt, and 122t. As shown in FIG. 9B, the sidewall 182S may have a substantially straight portion 182SF and curved portions 182SB and 182ST. Other process steps and details of the present embodiments are similar to the embodiments of FIGS. 1-13D, and thereto not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that multi-layer sacrificial layers are used to balance the etch rate difference between each surface orientation, thereby optimizing the epitaxy and etching and achieving straight sidewall of inner spacers. The straight sidewall of the inner spacer may extend along the {110} of the channel layer/substrate. Another advantage is that the inner spacers having the straight sidewall can result a box-shape profile, thereby improving gate length control and variability and protecting the source/drain epitaxial structure from being etched during channel release.

According to some embodiments of the present disclosure, a method includes forming an epitaxial stack over a semiconductor substrate, wherein the epitaxial stack comprises a plurality of sacrificial layers and a plurality of channel layers alternately arranged over the semiconductor substrate, and each of the sacrificial layers is a multi-layer film comprising a bottom epitaxial layer, a middle epitaxial layer over the bottom epitaxial layer, and a top epitaxial layer over the middle epitaxial layer, wherein the middle epitaxial layer has a lower germanium concentration than a germanium concentration of the bottom and top epitaxial layers; laterally recessing the sacrificial layers to form sidewall recesses alternating with the channel layers; forming inner spacers in the sidewall recesses; forming source/drain epitaxial structures on opposite sides of the channel layers.

According to some embodiments of the present disclosure, a method includes forming a fin comprising a stack of alternating channel layers and sacrificial layers, wherein each of the sacrificial layers is a multi-layer film comprising a first epitaxial layer, a second epitaxial layer over the first epitaxial, and a third epitaxial layer over the second epitaxial layer; laterally etching the sacrificial layers, wherein the first and third epitaxial layers have a different semiconductor composition than the second epitaxial layer, but have a width same as a width of the second epitaxial layer after the lateral etching is complete; forming inner spacers on opposite sides of the laterally etched sacrificial layers; and replacing the sacrificial layers with a gate structure.

According to some embodiments of the present disclosure, a semiconductor device includes a plurality of channel layers, a gate structure, source/drain structures, and a plurality of inner spacers. The channel layers are arranged one above another in a spaced apart matter. The gate structure surrounds each of the plurality of channel layers. The source/drain epitaxial structures are on opposite sides of the gate structure, respectively. The inner spacers alternate with the plurality of channel layers, the inner spacers spacing the gate structure apart from the source/drain epitaxial structures. Each of the inner spacers has a straight vertical sidewall having a height greater than about twice a thickness of each of the plurality of channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an epitaxial stack over a semiconductor substrate, wherein the epitaxial stack comprises a plurality of sacrificial layers and a plurality of channel layers alternately arranged over the semiconductor substrate, and each of the sacrificial layers is a multi-layer film comprising a bottom epitaxial layer, a middle epitaxial layer over the bottom epitaxial layer, and a top epitaxial layer over the middle epitaxial layer, wherein the middle epitaxial layer has a lower germanium concentration than a germanium concentration of the bottom and top epitaxial layers;
    laterally recessing the sacrificial layers to form sidewall recesses alternating with the channel layers;
    forming inner spacers in the sidewall recesses; and
    forming source/drain epitaxial structures on opposite sides of the channel layers.

2. The method of claim 1, wherein the germanium concentration of the middle epitaxial layer is greater than a germanium concentration of the channel layers.

3. The method of claim 1, wherein the middle epitaxial layer has a greater silicon concentration than a silicon concentration of the bottom and top epitaxial layers.

4. The method of claim 3, wherein the silicon concentration of the middle epitaxial layer is less than a silicon concentration of the channel layers.

5. The method of claim 1, wherein the channel layers are silicon layers, and the sacrificial layers are silicon germanium layers.

6. The method of claim 1, wherein laterally recessing the sacrificial layers is performed such that each of the sacrificial layers has a straight sidewall substantially vertical to a top surface of the semiconductor substrate.

7. The method of claim 6, wherein a height of the straight sidewall is greater than a thickness of the middle epitaxial layer.

8. The method of claim 1, wherein laterally recessing the sacrificial layers is performed such that each of the sacrificial layers has a straight sidewall substantially parallel with {110} facet of the semiconductor substrate.

9. The method of claim 1, wherein laterally recessing the sacrificial layers is performed using a fluorine-based gas.

10. The method of claim 1, further comprising:
    removing the bottom, middle, and top epitaxial layers of the sacrificial layers to release the channel layers; and
    forming a metal gate structure around the channel layers after releasing the channel layers.

11. A method, comprising:
    forming a fin comprising a stack of alternating channel layers and sacrificial layers, wherein each of the sacrificial layers is a multi-layer film comprising a first epitaxial layer, a second epitaxial layer over the first epitaxial layer, and a third epitaxial layer over the second epitaxial layer;
    laterally etching the sacrificial layers, wherein the first and third epitaxial layers have a different semiconductor composition than the second epitaxial layer, but have a width same as a width of the second epitaxial layer after the lateral etching is complete;
    forming inner spacers on opposite sides of the laterally etched sacrificial layers; and
    replacing the sacrificial layers with a gate structure.

12. The method of claim 11, wherein the channel layer has a different semiconductor composition than the first to third epitaxial layers, and laterally etching the sacrificial layers is performed such that the a width of each of the first, second, and third epitaxial layers is less than a width of the channel layer.

13. The method of claim 11, wherein forming inner spacers is performed such that the inner spacers have substantially straight vertical sidewalls adjoining the first to third epitaxial layers.

14. The method of claim 13, wherein replacing the sacrificial layers with the gate structure is performed such that the gate structure is in contact with the substantially straight vertical sidewalls of the inner spacers.

15. The method of claim 11, wherein a thickness of the second epitaxial layer is greater than a thickness of the first and third epitaxial layers.

16. The method of claim 11, wherein a thickness of the sacrificial layers is greater than a thickness of the channel layers.

17. A method, comprising:
    forming a plurality of channel layers and sacrificial layers alternately arranged over a semiconductor substrate, wherein one of the sacrificial layers comprises a bottom epitaxial layer, a middle epitaxial layer over the bottom epitaxial layer, and a top epitaxial layer over the middle epitaxial layer, and a the middle epitaxial layer has a lower germanium concentration than a germanium concentration of the bottom and top epitaxial layers;
    forming a plurality of inner spacers between the channel layers, wherein one of the inner spacers comprises a sidewall extending between adjacent two of the channel layers and in contact with the bottom epitaxial layer, the middle epitaxial layer and the top epitaxial layer;
    replacing the sacrificial layer with a gate structure surrounding the channel layers; and forming a plurality of source/drain epitaxial structures on opposite sides of the channel layers.

18. The method of claim 17, wherein the germanium concentration of the middle epitaxial layer is greater than a germanium concentration of one of the channel layers.

19. The method of claim 17, wherein the middle epitaxial layer has a greater silicon concentration than a silicon concentration of the bottom and top epitaxial layers.

20. The method of claim 17, wherein the sidewall of the one of the inner spacers comprises a straight vertical sidewall, a top curved sidewall and a bottom curved sidewall, the top and bottom curved sidewalls respectively extends from a top end and a bottom end of the straight vertical sidewall, and a height of the straight vertical sidewall is greater than a height of the top curved sidewall and a height of the bottom curved sidewall.

* * * * *